United States Patent
Hashimoto et al.

(10) Patent No.: US 7,601,992 B2
(45) Date of Patent: Oct. 13, 2009

(54) LIGHT DETECTING ELEMENT AND CONTROL METHOD OF LIGHT DETECTING ELEMENT

(75) Inventors: Yusuke Hashimoto, Neyagawa (JP); Yuji Takada, Kyoto (JP); Fumikazu Kurihara, Nara (JP); Fumi Tsunesada, Osaka (JP)

(73) Assignee: Matsushita Electric Works, Ltd., Kadoma (JP)

( * ) Notice: Subject to any disclaimer, the term of this patent is extended or adjusted under 35 U.S.C. 154(b) by 392 days.

(21) Appl. No.: 10/563,619

(22) PCT Filed: Mar. 17, 2005

(86) PCT No.: PCT/JP2005/005469
§ 371 (c)(1),
(2), (4) Date: Jan. 6, 2006

(87) PCT Pub. No.: WO2005/088720
PCT Pub. Date: Sep. 22, 2005

(65) Prior Publication Data
US 2007/0103748 A1  May 10, 2007

(30) Foreign Application Priority Data
Mar. 17, 2004 (JP) ............................. 2004-077098

(51) Int. Cl.
G02B 5/32 (2006.01)

(52) U.S. Cl. .................. 257/184; 257/187; 257/259; 257/292; 257/461; 257/225; 257/239; 257/E27.082; 257/E27.083; 257/E27.15; 257/E29.227; 257/E29.24; 359/15

(58) Field of Classification Search ............... 257/79, 257/184, 187, 259, 292, 461, 225, 239, E27.082, 257/E27.083, E29.24, E29.227, E27.15; 359/15
See application file for complete search history.

(56) References Cited

U.S. PATENT DOCUMENTS 3,435,236 A    3/1969   Love, III et al.

(Continued)

FOREIGN PATENT DOCUMENTS

DE    197 04 496 A1    3/1998

(Continued)

OTHER PUBLICATIONS

Chinese Examination Report.

(Continued)

*Primary Examiner*—Wael Fahmy
*Assistant Examiner*—Marc Armand
(74) *Attorney, Agent, or Firm*—Edwards Angell Palmer & Dodge LLP

(57) ABSTRACT

A light detecting element 1 including an element formation layer 22 which contains a well region 31. A surface electrode 25 is formed on the layer 22 through an insulating layer 24. The region 31 contains an electron holding region 32. The region 32 contains a hole holding region 33. The layer 24 contains a control electrode 26 facing the region 33 through the layer 24. Electrons and holes are generated at the layer 22. There are two selected states. In one state, by controlling each electric potential applied to the electrodes 25, 26, electrons are gathered at the region 32, while holes are held at the region 33. In another state, recombination is stimulated between the electrons and the holes. After the recombination, the remaining electrons are picked out as received light output.

7 Claims, 11 Drawing Sheets

U.S. PATENT DOCUMENTS

| | | | |
|---|---|---|---|
| 6,023,293 A * | 2/2000 | Watanabe et al. ........... 348/294 | |
| 6,150,676 A | 11/2000 | Sasaki | |
| 2003/0209712 A1 | 11/2003 | Fujita et al. | |
| 2004/0021057 A1 | 2/2004 | Drowley | |
| 2005/0116259 A1 * | 6/2005 | Komori ...................... 257/222 | |

FOREIGN PATENT DOCUMENTS

EP   1 028 470 A2   8/2000

JP   2001-337166   12/2001

OTHER PUBLICATIONS

P. Gulden, et al.; "Novel Optical Distance Sensor Based on MSM Technology;" Proceedings of IEEE Sensors 2002. Orlando, Florida, Jun. 12-14, 2002, *IEEE International Conference on Sensors*, New York, New York: IEEE, US, vol. 1 of 2, Conf. 1; Jun. 12, 2002; pp. 86-91.

* cited by examiner

LIGHT DETECTING ELEMENT AND CONTROL METHOD OF LIGHT DETECTING ELEMENT

BACKGROUND OF THE INVENTION

1. Field of the Invention

The invention relates a light detecting element and a control method of the light detecting element.

2. Description of the Related Art

A conventional light detecting element is known by different element names such as a photodiode, phototransistor, CCD image sensor, etc. Such an element is widely utilized in different applications such as a photosensor which detects presence of a physical object based on variation of strength of the received light, optical (light) communication which uses light as transmission medium, distance sensor (rangefinder) which optically measures distance based on triangulation method, phase difference between the issued light and the received light, etc, image pick-up device such as a video camera or digital camera, or the like.

In these applications, there is a case that a light source is used together with the light detecting element such as the photosensor which monitors an intruder, the optical communication such as (infrared) light remote controller, the distance sensor which is used in an auto focus camera or robot eye, the image pick-up device which is used together with the light source in order to obtain a distance image, or the like. In this case, since the element receives not only the light from the light source but also ambient light such as natural light, the strength of the received light increases as compared with a case that only the light from the light source is received.

In this kind of the light detecting element, carriers (electrons or electron holes) are generated within the element by the quantity corresponding to quantity of the received light. However, the generated quantity of the carriers gradually approaches a saturation level as the quantity of the received light increases because there is a limitation in the quantity of the carriers generated according to the quantity of the received light. Therefore, when the ambient light is received together with a signal light which includes object information in an application such as the above, there is a problem in that a large output cannot be obtained from the signal light since dynamic range of the element is reduced by the quantity of the ambient light.

Also, when the signal light is intermingled with the ambient light, there is a possibility that the signal light cannot be distinguished from the intermingled light if the ambient light fluctuates. It is possible to distinguish the signal light from the intermingled light by using an optical filter which passes a specific wavelength components included in the signal light. However, when the ambient light has spectrum components spreading over a wide range such as sun light, influence of the ambient light cannot be sufficiently removed even through the optical filter.

In another prior art for separating the signal light and the ambient light, output of the element is separated into components of the signal light and components of the ambient light. For example, a prior art described in Japanese Laid-open Patent Publication No. 2001-337166 reduces or cancels the components of the ambient light by finding differential components between the light received in a light period and the light received in a extinction period while intermittently operating the light source. The light period is a period of time that the light source is operated, while the extinction period is a period of time that the light source is extinguished (not operated). Namely, in such a short period of time in which the ambient light does not fluctuate, the differential components are calculated by subtracting output corresponding to the received light with only the components of the ambient light in the extinction period from output corresponding to the received light with the components of the ambient light and the signal light in the light period. As a result, it becomes possible to suppress the components of the ambient light to significantly increase rate of the components of the signal light.

However, in the prior art described Japanese Laid-open Patent Publication No. 2001-337166, there is a problem is that the components of the signal light cannot be detected when the element is saturated. This is because the prior art calculates the differential components at an external circuit for the light detecting element in order to separate the output of the element into the components of the signal light and the components of the ambient light. That is, the dynamic range for the signal light of the element becomes narrow under the presence of the ambient light and therefore the prior art cannot still solve the problem that a large output cannot be obtained from the light detecting element according to the signal light.

Expanding upon the above, it is necessary to increase the number of the carriers generated by light irradiation in order to reduce the influence of shot noise. This is because the limitation of detection precision of the element is generally decided by the shot noise attended with photoelectric conversion. When being under the saturation level, the number of the carriers becomes larger as the strength of the received light becomes stronger and also the light receiving time becomes longer (i.e., the quantity of the received light becomes larger). Therefore, it is possible to reduce the influence of the shot noise by increasing the irradiation strength of the light source or lengthening the light receiving time of the light detecting element. However, the SN ratio cannot be sufficiently increased even though the irradiation quantity of the source is increased or the light receiving time of the element is lengthened. This is because the dynamic range of the element is reduced under the presence of the ambient light.

The prior art also requires reading out at least two times from an image pick-up device such as a CCD sensor or an MOS type sensor (i.e., the light detecting element). This is because the output corresponding to the received light must be picked out twice from the image pick-up device in order to take the differential components. Namely, because read out time of 2 frames is taken until a detection result is obtained, its response speed is reduced by the time.

SUMMARY OF THE INVENTION

An object of the present invention is to prevent saturation by the ambient light without an external circuit to detect the components of the signal light, which can improve the dynamic range for the signal light.

Another object of the invention is to prevent reduction of the response speed even if the image pick-up device has array construction.

A light detecting element is formed in a semiconductor device and comprises a photosensitive unit, a carrier separation unit, a recombination unit and an output unit. The photosensitive unit is configured to receive light irradiated from a light source and generate electrons and holes, each of which the number varies with quantity of light received at the photosensitive unit. The carrier separation unit has a separation control electrode. The carrier separation unit is also configured to separate the electrons and holes generated at the photosensitive unit into object carriers and non-object carriers according to control of electric potential applied to the separation control electrode. The object carriers are one of the electrons and holes, and the non-object carriers are another of them. The recombination unit has a recombination control electrode. The recombination unit is also configured to stimulate recombination between the object carriers generated at the photosensitive unit in a light period and the non-object carriers generated at the photosensitive unit in an extinction period according to control of electric potential applied to the recombination control electrode. The light period is a period of time that the light source is operated, and the extinction period is a period of time that the source is extinguished. The output unit is configured to pick out the object carriers which remain after the recombination at the recombination unit.

In this construction, the recombination occurs between the object carriers generated at the photosensitive unit in the light period and the non-object carriers generated at the photosensitive unit in the extinction period. After the recombination, the remaining object carriers are picked out to external. Therefore, equivalent object carriers to the ambient light can be removed from equivalent object carriers to light (hereinafter referred to as an "input signal light") from the light source received at the photosensitive unit, and components of the ambient light can be significantly removed from the object carriers remained after the recombination. As a result, it is possible to reduce the components of the ambient light in the object carriers transferred from the recombination unit to the output unit, and prevent saturation of the output unit owing to the components. The functions described above can be realized by one semiconductor device. Therefore, it is possible to significantly increase dynamic range for the input signal light because the saturation of the output unit can be preferably prevented as compared with a case that components of the ambient light are removed from an output signal of a semiconductor device. Also, when constituting an image pick-up device by arranging plural light detecting elements, it is possible to prevent reduction of response speed. This is because received light output is obtained from equivalent object carriers to difference of quantity of the light received in the different two periods by installing the recombination unit in the light detecting element, and it is unnecessary to read out image by two frames from the image pick-up device.

The carrier separation unit is preferably configured to adjust so that the number of the object carriers which are generated in the light period to be given to the recombination at the recombination unit is larger than that of the non-object carriers which is generated in the extinction period to be given to the recombination.

In this construction, it is simple to remove the components of the ambient light in the extinction period from the object carriers remained after the recombination at the recombination unit since the carrier separation unit adjusts relation between the number of the object carriers and the number of the non-object carriers generated at the photosensitive unit.

Preferably, the light detecting element further includes an object carrier holding unit and a non-object carrier holding unit. The object carrier holding unit is configured to gather the object carriers generated at the photosensitive unit to hold the object carriers until the recombination. The non-object carrier holding unit is configured to gather the non-object carriers generated at the photosensitive unit to hold the non-object carriers until the recombination. The recombination unit is configured to stimulate the recombination between the object carriers held at the object carrier holding unit and the non-object carriers held at the non-object carrier holding unit.

In this construction (hereinafter referred to as a "third construction"), because the carriers are separated into the object carriers and the non-object carriers to be held until the recombination, it is possible to hold and separate them so as not to cause the recombination to occur between the object carriers and the non-object carriers generated in the two different periods.

Preferably, the carrier separation unit further includes a switch unit for disposing of the object carriers held at the object carrier holding unit. In this construction, it is possible to dispose of the object carriers generated in one of the light period and the extinction period. Therefore, because only the non-object carriers generated in said one period are held, it is possible to increase the difference between the number of the object carriers and the number of the non-object carriers on the recombination at the recombination unit. As a result, a comparatively large number of object carriers can be picked out after the recombination while comparatively shortening each of the extinction period and the light period. Also, sensitivity can be increased.

The output unit preferably includes an integration function for integrating the object carriers which remain after the recombination at the recombination unit. In this construction, even though the number of the object carriers obtained from the recombination unit is few in one light period and one extinction period, it is possible to increase the number of the object carriers issued from the output unit by integrating the object carriers at the output unit.

The light detecting element preferably includes an element formation layer, a well region, a surface electrode, a first holding region, a second holding region and a common control electrode. The element formation layer is a first conductive type and is formed on a main surface of a semiconductor substrate. The well region is a second conductive type and is formed at a main surface side within the element formation layer. The surface electrode is formed on the main surface of the element formation layer to face at least the well region though an insulating layer. The surface electrode also has translucency. The first holding region is the second conductive type and is formed within the well region and at the main surface side of the element formation layer as the object carrier holding unit. The second holding region is the first conductive type and is formed within the first holding region and at the main surface side of the element formation layer as the non-object carrier holding unit. The common control electrode functions as the separation control electrode and the recombination control electrode. Also, the common control electrode has translucency and is located to face the second holding region through the insulating layer. The photosensitive unit includes the element formation layer which generates the electrons and holes. The recombination unit includes at least one of the first holding region and the second holding region.

In this construction (hereinafter referred to as a "sixth construction"), the light detecting element of the third construction can be realized by the semiconductor device having a comparatively simple structure. Especially, it can be made compact because the recombination unit includes at least one of the first holding region and the second holding region.

Preferably, the light detecting element further comprises a drain region and a drain electrode. The drain region is the second conductive type and is provided for disposing of the object carriers from the object carrier holding unit. This drain region is formed at the main surface side within the element formation layer and in proximity to the well region. The drain electrode is coupled to the drain region by ohmic coupling. This drain electrode is applied with electric potential so as to dispose of the object carriers from the first holding region to the drain region.

In this construction (hereinafter referred to as a "seventh construction"), it is possible to increase the difference of the number of the object carriers and the non-object carriers on the recombination. This is because the drain region can dispose of the object carriers generated in one period of the light period and the extinction period, and then the non-object carrier holding unit can hold only the non-object carriers generated in said one period. As a result, it is possible to pick out comparatively many of the object carriers after the recombination to increase sensitivity while comparatively shortening the light period and the extinction period.

The light detecting element preferably includes an element formation layer, a well region, a surface electrode, a holding region and a common control electrode. The element formation layer is a first conductive type and is formed on a main surface of a semiconductor substrate. The well region is a second conductive type and is formed at a main surface side within the element formation layer as the object carrier holding unit. The surface electrode is formed on the main surface of the element formation layer to face at least the well region though an insulating layer. The surface electrode also has translucency. The holding region is the first conductive type and is formed within the well region and at the main surface side of the element formation layer as the non-object carrier holding unit. The common control electrode functions as the separation control electrode and the recombination control electrode. This common control electrode is located to face a part of the holding region through the insulating layer. The common control electrode also has translucency. The photosensitive unit includes the element formation layer which generates the electrons and holes, while the recombination unit includes at least one of inside and outside of the holding region within the well region.

In this construction (hereinafter referred to as a "eighth construction"), the light detecting element of the third construction can be realized by the semiconductor device having a comparatively simple structure. Especially, it can be made compact because the recombination unit includes at least one of inside and outside of the holding region within the well region.

The light detecting element preferably includes an element formation layer, a well region, a surface electrode, a holding region and a common control electrode. The element formation layer is a second conductive type and is formed on a main surface of a semiconductor substrate of the second conductive type through an intermediate layer of a first conductive type. The well region is the second conductive type and is formed at a main surface side within the element formation layer as the object carrier holding unit. The surface electrode is formed on the main surface of the element formation layer to face at least the well region though an insulating layer. The surface electrode also has translucency. The holding region is the first conductive type and is formed within the well region and at the main surface side of the element formation layer as the non-object carrier holding unit. The common control electrode functions as the separation control electrode and the recombination control electrode. This common control electrode is located to face a part of the holding region through the insulating layer. The common control electrode also has translucency. The photosensitive unit includes the element formation layer which generates the electrons and holes, while the recombination unit includes at least one of inside and outside of the holding region within the well region.

In this construction (hereinafter referred to as a "ninth construction"), the light detecting element of the third construction can be realized by the semiconductor device having comparatively simple structure. Especially, it can be made compact because the recombination unit includes at least one of inside and outside of the holding region within the well region. It is also possible to make even the depths of the element formation layer function as the photosensitive unit which generates the electrons and holes since the well region and the element formation layer are formed by the semiconductor of the same conductive type. It is further possible to simply separate the object carriers and the non-object carriers by adjusting each electric potential of the substrate and the intermediate layer. This is because there is the intermediate layer between the substrate and the element formation layer, and the conductive type of the intermediate layer is different from that of each of the substrate and the element formation layer.

Preferably, the light detecting element further includes a buried layer. The buried layer is provided for increasing potential barrier between the well region and the element formation layer and formed at the bottom of the well region. The well region within the element formation layer is formed so as to be apart from the substrate.

In this construction (hereinafter referred to as a "tenth construction"), it is possible to prevent the leakage of the object carriers from the well region to the substrate by the buried layer formed at the bottom of the well region. As a result, more object carriers can be transferred to the output unit as compared with a case that there is no buried layer.

A control method of the light detecting element of the third construction includes controlling the electric potential applied to the separation control electrode so as to gather the object carriers at the object carrier holding unit while disposing of the non-object carriers in the light period. The control method also includes controlling the electric potential applied to the separation control electrode so as to gather the non-object carriers at the non-object carrier holding unit while disposing of the object carriers in the extinction period.

In this method, it is possible to theoretically obtain equivalent object carriers corresponding to difference of the quantity of light received in the light period and the extinction period after the recombination between the object carriers and the non-object carriers. This is because the object carriers are gathered in the light period, while the non-object carriers are gathered in the extinction period. As a result, components of the ambient light can be significantly eliminated from the received light output.

A control method of the light detecting element of one of the sixth to tenth construction includes applying to the common control electrode an electric potential for holding the object carriers and the non-object carriers at the object carrier holding unit and the non-object carrier holding unit, respectively. After this, the control method also includes changing the electric potential applied to the common control electrode so that at least one of the object carriers held at the object carrier holding unit and the non-object carriers held at the non-object carrier holding unit moves to be given to the recombination between the object carriers and the non-object carriers.

A control method of the light detecting element of the eighth or ninth construction includes applying to the common control electrode with electric potential for holding the object carriers and the non-object carriers at the object carrier holding unit and the non-object carrier holding unit respectively. After this, the control method includes changing the electric potential applied to the common control electrode at plural times so that the recombination is stimulated between the object carriers and the non-object carriers by making the object carriers move back and forth between an inside and outside of the holding region within the well region, and also by making the non-object carriers move back and forth between parts facing and not facing the common control electrode within the holding region.

In this method, it is possible to stimulate the recombination at the part facing the common control electrode within the holding region. The recombination is stimulated between the non-object carriers and the object carriers, and the non-object carriers are trapped at interface of the holding region by potential of the interface. Because all non-object carriers cannot be made to disappear by one-time movement of the object carriers to the holding region, the carriers move back and forth at plural times. It is also possible to extract components corresponding to the input signal light by a comparatively simple control for the electric potential applied to the common control electrode and the timing for applying the potential. Because current does not flow to external when the object carriers move back and forth between the holding region and the well region, low power consumption can be realized.

A control method of the light detecting element of the eighth or ninth construction includes controlling the electric potential applied to each of the surface electrode, the common control electrode and the substrate so as to gather the non-object carriers at the holding region while disposing of the object carriers in the extinction period. The control method also includes controlling the potential so as to gather the object carriers at the holding region while disposing of the non-object carriers in the light period.

In this method (hereinafter referred to as a "fourteenth construction"), it is possible to theoretically obtain equivalent object carriers corresponding to difference of the quantity of light received in the light period and the extinction period after the recombination between the object carriers and the non-object carriers. As a result, components of the ambient light can be pretty eliminated from the received light output.

A control method of the light detecting element of the fourteenth construction includes reversing polarity between each electric potential applied to the surface electrode and the common control electrode and the electric potential applied to the substrate, in a state for gathering the object carriers during the light period and a state for gathering the non-object carriers during the extinction period. The control method also includes reversing polarity of the electric potential applied to the common control electrode at plural times in a state for stimulating the recombination between the object carriers and the non-object carriers in at least one of the light period and the extinction period. The control method further includes picking out the object carriers remained at the well region after the recombination.

In this method, it is possible to gather the object carriers and the non-object carriers at the holding region in the light period and the extinction period, respectively. It is also possible to stimulate the recombination mainly in the holding region by the transfer of the object carriers and the non-object carriers between the inside and the outside of the holding region. Moreover, probability of the recombination can be increased by repeating said transfer at plural times.

BRIEF DESCRIPTION OF THE DRAWINGS

Preferred embodiments of the invention will now be described in further details. Other features and advantages of the present invention will become better understood with regard to the following detailed description and accompanying drawings where.

DETAILED DESCRIPTION OF EXEMPLARY EMBODIMENTS

Figure 1:
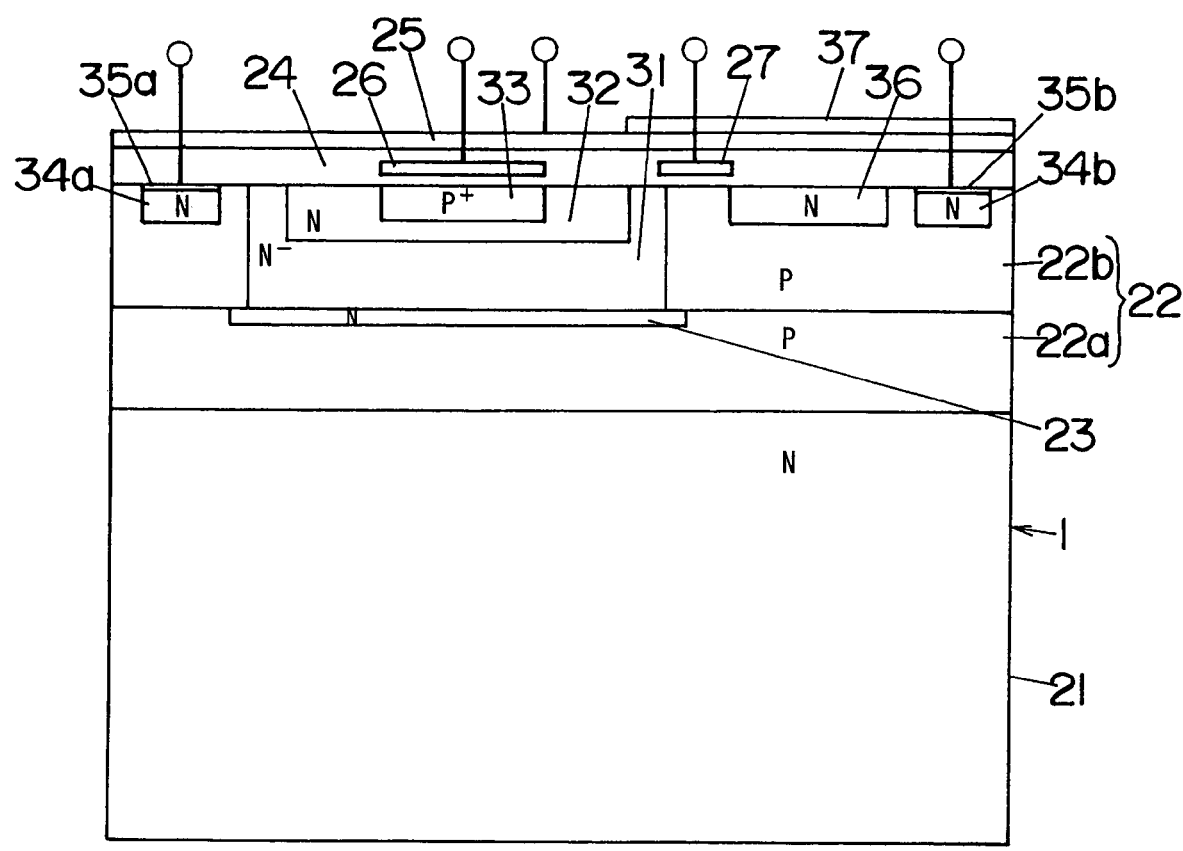
FIG. 1 is a sectional view of a light detecting element of a first embodiment according to the present invention, FIGS. 2A and 2B describe the operation of the light detecting element of FIG. 1, FIG. 3 describes the operation of the light detecting element of FIG. 1.
Figure 2:
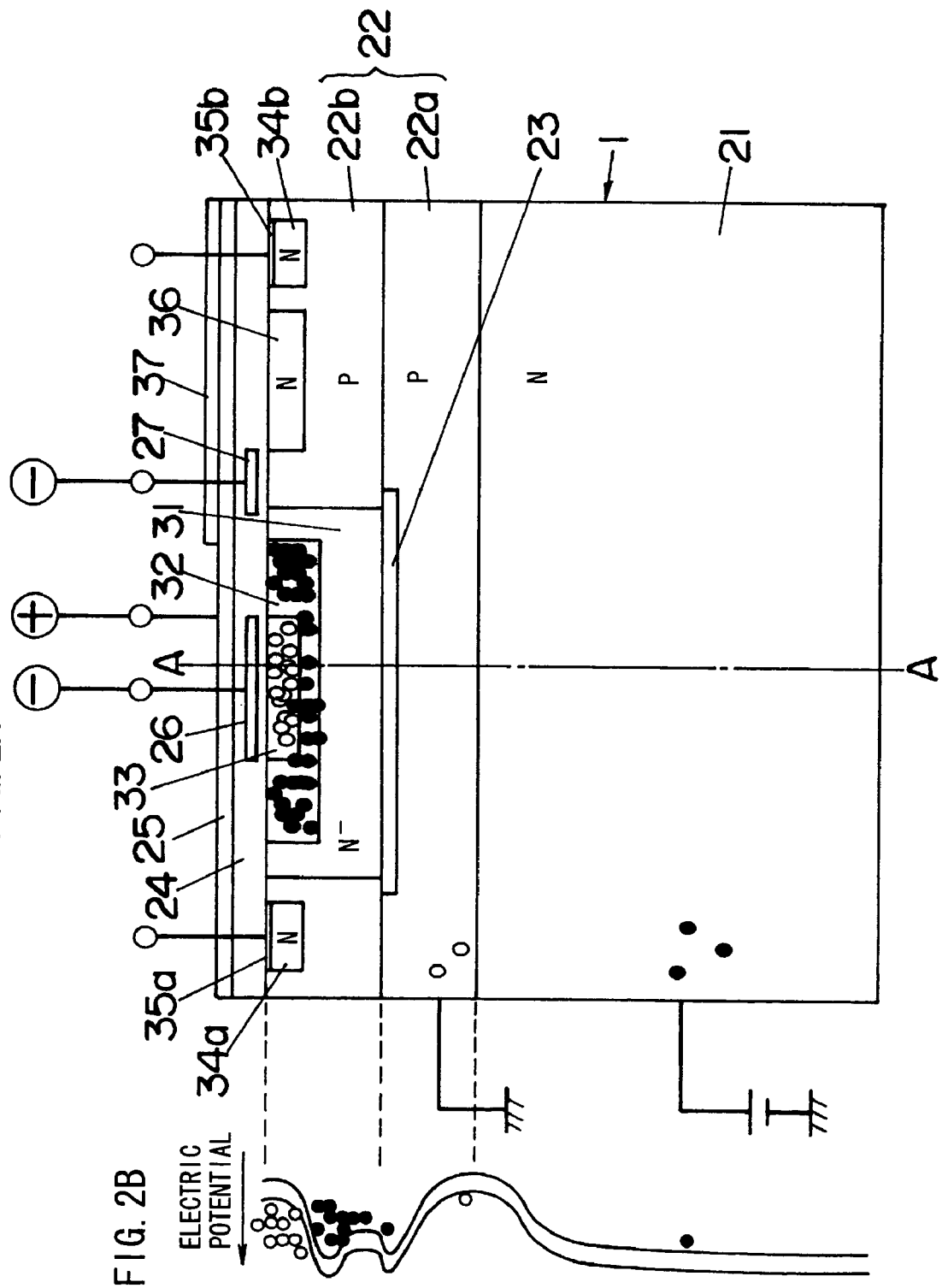
Figure 3:
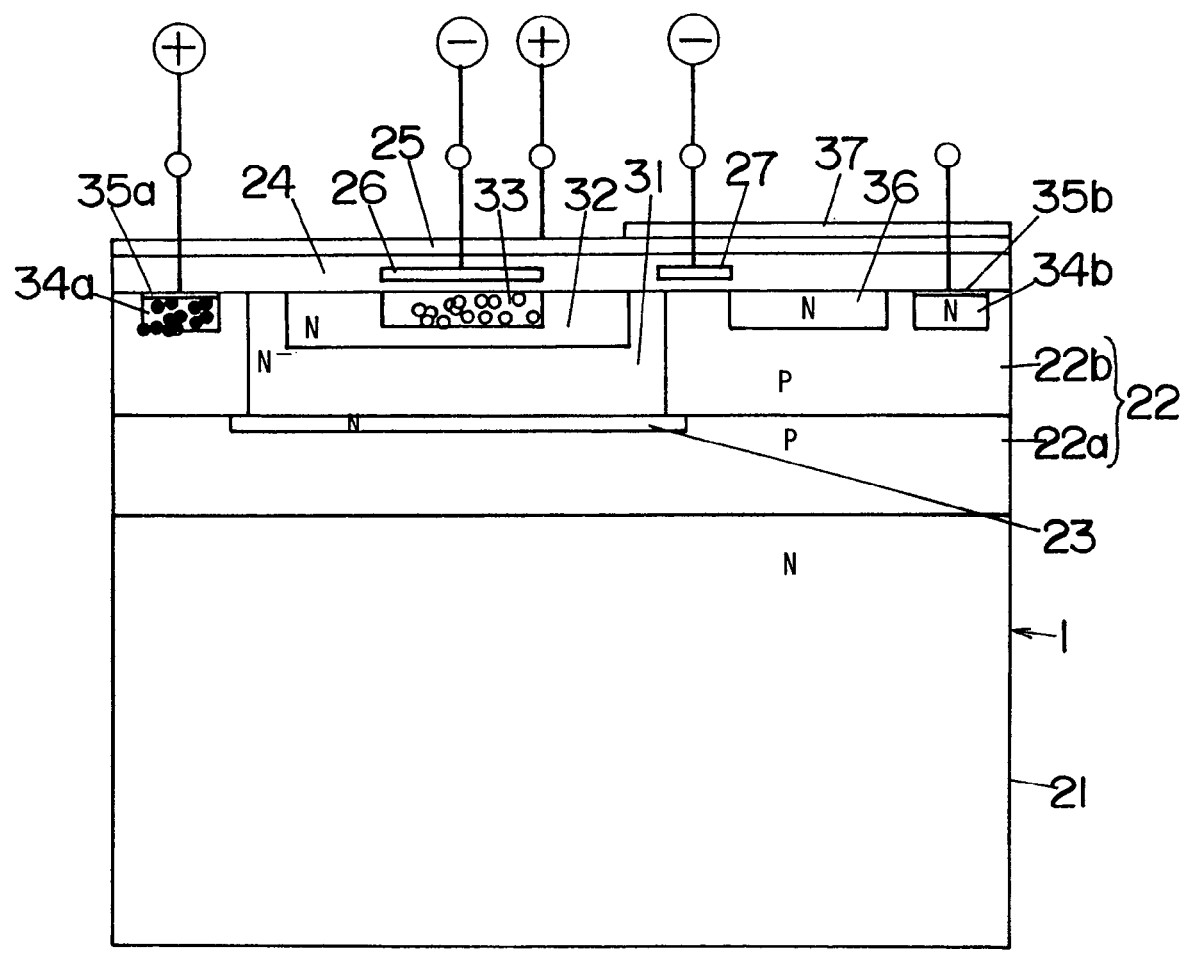
Figure 4:
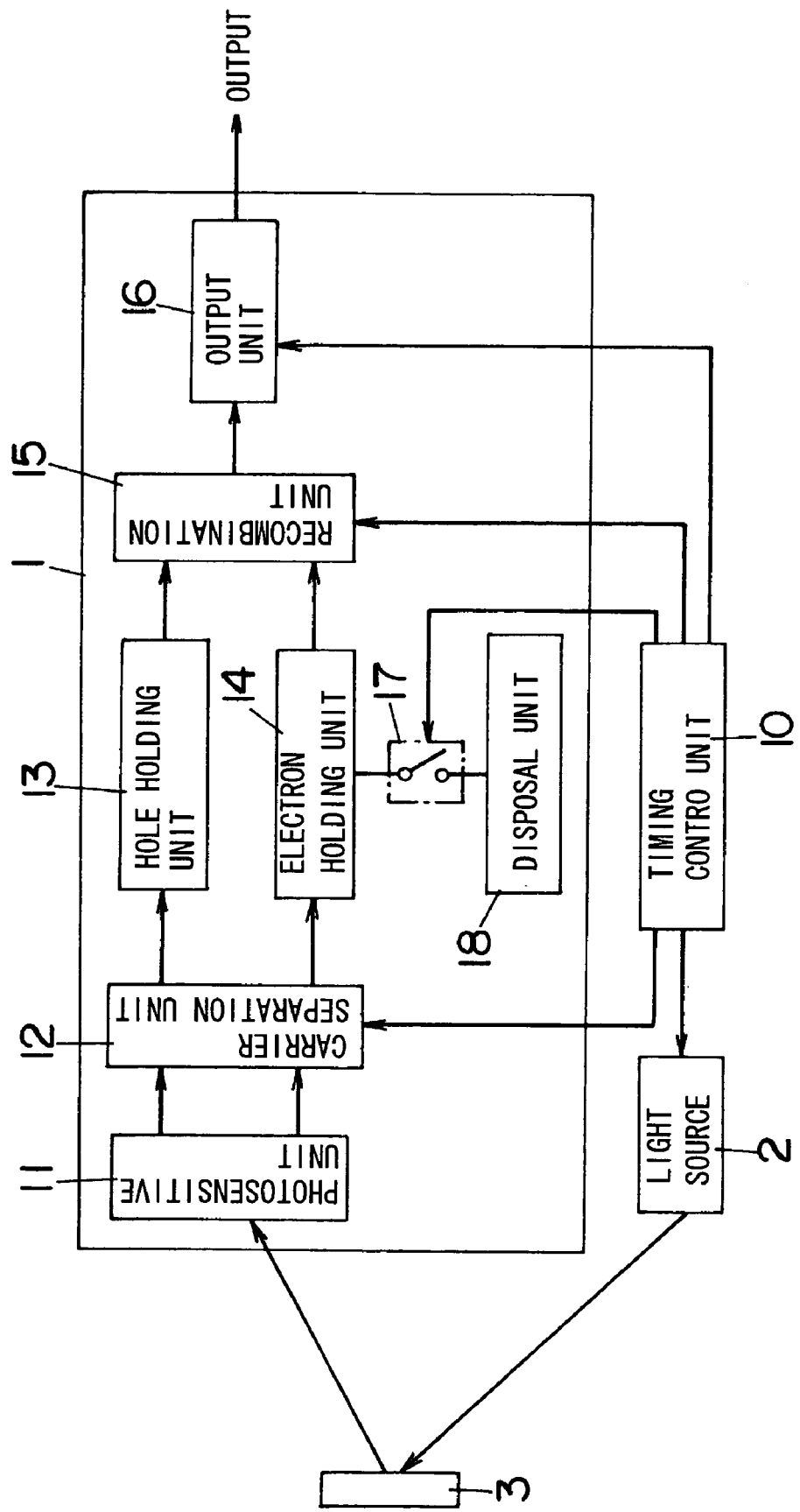
FIG. 4 is a principal block diagram of a distance sensor equipped with the light detecting element of FIG. 1, FIG. 5 describes the operation principle of the light detecting element of FIG. 1.

FIGS. 1-3 show a light detecting element 1 of a first embodiment according to the present invention, and FIG. 4 shows a distance sensor which measures distance by using the light detecting element 1. This sensor is constructed with a light source 2, the light detecting element 1 and a timing control unit 10. The source 2 emits light as output signal light on object space. This object space includes a physical object 3 (distance to be measured) away from the sensor. The element 1 receives light (hereinafter referred to as "input light") from the object space. The input light includes the light (hereinafter referred to as "input signal light") from the source 2 reflected by the object 3 depending on the situation. The sensor obtains output corresponding to the received light from the element 1. The output represents quantity of the input light from the object space.

In a general way, the above-mentioned distance is measured by calculating light transmission time from a point in time on which the source 2 emits the output signal light to a point in time on which the element 1 receives the input signal light. The sensor modulates strength of the output signal light based on a modulation signal formed by a suitable wave form such as a sine wave as well as the general way. The sensor then detects a phase difference between modulation wave form of the output signal light and modulation wave form of the input light signal. Then, the sensor converts the phase difference into the distance to be measured. A light emitting diode or semiconductor laser is mainly used as the source 2.

The strength of the output signal light is modulated based on a modulation signal issued from a timing control unit 10. The modulation signal is formed by a sine wave with a fixed modulation frequency (e.g., 20 MHz). There are a period of time (hereinafter referred to as a "light period") that the source 2 emits the output signal light and a period of time (hereinafter referred to as an "extinction period") that the source 2 does not emit the output signal light. The light period and the extinction period are alternated. In the light period, the output signal light is emitted during a period of time which is plural times (e.g., 10,000 times) of a cycle of the modulation signal. In short, the source 2 is intermittently lit (operated).

In the extinction period, the light received by the element 1 consists of only ambient light and does not include the input signal light. In the light period, the light received by the element 1 includes the ambient light and the input signal light, and microscopically fluctuates. This is because the input signal light is obtained from the output signal light whose strength is modulated. Namely, because the output signal light whose strength is modulated by a high frequency signal is intermittently emitted, the light period becomes a period of time which the output signal light is emitted. In short, the received light mainly consists of the ambient light in the extinction period, while the received light mainly consists of the ambient light and the input signal light in the light period. Therefore, by subtracting the quantity of the light received in the extinction period from quantity of the light received in the light period, it is theoretically possible to eliminate components of the ambient light to pick out only components of the input signal light.

The sensor further comprises a distance arithmetic unit (not shown) to which output corresponding to the received light from the element 1 is issued. The distance arithmetic unit picks out the output from the element 1 at different timing. The unit obtains the light transmission time from the phase difference between the wave form of the output signal light whose strength is modulated and the wave from of the input signal light whose strength fluctuates according to the strength of the output signal light. Then, the unit obtains the distance from the light transmission time.

By using only one of the element 1, it is possible to measure distance between the sensor and the object 3 which exists in a specific direction around the sensor.

Also, by constituting a image pick-up device from a plural of the element 1, a distance image can be produced. In this case, a receiving optical system is located in front of the image pick-up device and each element 1 of the image pick-up device is directed towards the object space through the receiving optical system. Therefore, each pixel of the distance image corresponds to distance in the direction which is allocated to the pixel. For example, each element 1 is located on a rectangular plane with a plural of unit grid to be arranged at each grid. The element 1 further comprises an output unit 16 which issues output corresponding to the received light, while an output of the image pick-up device is constructed with a plural of the unit 16. In this case, it is possible to constitute the output of the image pick-up device as well as charge transfer unit (structure) in CCD (charge coupled device) image sensor. By using the image pick-up device, the distance image is produced.

The element 1 generates electrons and electron holes (hereinafter referred to as "hole(s)"), each of which the number varies with quantity of the received light. In the first embodiment, the electron of them is treated as an object carrier, while the hole is treated as a non-object carrier. Value of the output corresponding to the received light from the element 1 is decided by the number of the object carriers (i.e., electrons).

The element 1 as shown in FIG. 1 is provided on a main surface of a N-type (first conductive type) semiconductor (e.g., silicon) substrate 21 to comprise an element formation layer 22 of P-type (second conductive type) which is formed on the main surface. The layer 22 is composed of a first layer 22a which is in contact with the substrate 21, and a second layer 22b which faces the substrate 21 through the first layer 22a. In a part of the layer 22a, a N-type buried layer 23 is formed to be in contact with the layer 22b. The thickness of the layer 22a is set to, for example, 5 μm. In a main surface of the layer 22, an insulating layer 24 is formed to be contact with the layer 22 (22b), while a surface electrode 25 is formed to face the layer 22 through the layer 24. The layer 24 is an oxidation layer (e.g., silicon oxidation layer). In the layer 24, a control electrode 26 and a gate electrode 27 are buried so as to be apart from the main surface of the layer 22, while the electrodes 26, 27 are spaced each other along the surface of the layer 22. Namely, the electrodes 26, 27 faces the layer 22 through a part of the layer 24. The electrodes 25, 26 are translucent.

In the layer 22b, a well region 31 is formed so as to face the layer 23. The region 31 is N⁻-type and has approximately same thickness as the layer 22b. In the region 31, a N-type electron holding region (first holding region) 32 is formed at the main surface side within the layer 22. In the region 32, a P⁺-type hole holding region (second holding region) 33 is formed at the main surface side within the layer 22. The above-mentioned electrode 26 is located to be opposite to the region 33.

In the main surface side within the layer 22b, a N-type drain region 34a is formed at one side (left) of the region 31, while a N-type drain region 34b is formed at other side (right) of the region 31. The region 34a, 34b have drain electrodes 35a, 35b coupled to the surfaces of the region 34a, 34b by ohmic coupling respectively. Each of the region 34a, 34b is formed along normal to the plane of FIG. 1. The region 34a is nearer to the region 31 than the region 34b.

Also, in the main surface side within the layer 22b, a N-type charge transfer region 36 is formed between the regions 31, 34b, while the region 36 is formed along the region 34b. In the layer 24, the above-mentioned electrode 27 is located at a position corresponding to an intermediate position between the regions 31, 36, and therefore MOS structure is constituted between the regions 31, 36. In surface of the electrode 25, a shading film 37 which has light blocking effect is formed at a position corresponding to the electrode 27 and regions 36, 34b.

As noted above, the element 1 has MIS device structure because the electrode 25 is provided on the substrate 21 and the layer 22 through the layer 24. A region without the film 37 functions as a photosensitive unit 11 (see FIG. 4) which generates electrons and holes in response to light irradiation. Electric potential of the layer 22 is set to a ground potential. Electric potential of the substrate 21 is set to a definite potential (hereinafter referred to as a "positive potential") higher than the ground potential by a positive voltage. The generated electrons and holes disappear in a comparative short time by recombination of them if they are left as they are. Therefore, in order to gather and separate the electrons and holes generated in response to the input light, electric potential of the electrode 25 is set to the positive potential, while electric potential of the electrode 26 is set to a potential (hereinafter referred to as a "negative potential") lower than the ground potential by a negative voltage.

By setting each electric potential as described above, electric potential of electrons (black circles) and electric potential of holes (white circles) become in state as shown in FIG. 2B. In FIG. 2B, the left curve shows potential energy of the holes and its energy of left side is higher than that of right side. The right curve shows potential energy of the electros and its energy of right side is higher than that of the left side. Therefore, the region 33 mainly gathers the holes of the carriers generated in proximity of the region 31 which include the regions 32, 33, while the electrons of the carriers are mainly gathered at the region 32. Because the quantity of the received light is represented by the number of the electrons gathered at the region 32 and the number of the holes gathered at the region 33, the number of the electrons and holes becomes larger as the quantity of the received light increases. Because the substrate 21 is applied with the positive potential and the layer 22 is applied with the ground potential, reverse bias is applied between the substrate 21 and the layer 22. As a result, the electrons and holes generated at the substrate 21 and the layer 22 disappear in a short time by disposal and recombination.

The operations in the extinction and light periods are sequentially explained. In the extinction period, the electrode 25 is applied with the positive potential, while the electrode 26 is applied with the negative potential. When the element 1 receives the input light, the carriers are generated at the unit 11. The electrons of the carriers are gathered at the region 32, while the holes of the carriers are gathered at the region 33.

After this operation, when the electrode 35a is applied with the positive potential, the electrons gathered at the region 32 move into the region 34a as shown in FIG. 3. That is, in the extinction period, the electrode 25 is applied with the positive potential, while the electric potential of the electrode 26 is kept in the negative potential. Immediately before the light period, the electrode 35a is applied with the positive potential. Then, because the holes generated in the extinction period remain at the region 33, while the electrons generated in the extinction period move into the region 34a to make the region 32 empty. In another example, by applying the negative potential to the electrode 25 while applying the positive potential to the electrode 35a, the generated electrons can be promptly moved into the region 34a.

In the light period, the electrode 25 is applied with the positive potential, while the electrode 26 is applied with the negative potential, as well as the extinction period. When the element 1 receives the input light, the carriers are generated at the unit 11. The electrons of the carriers are gathered at the region 32, while the holes of the carriers are gathered at the region 33. In this case, the region 33 includes the holes generated in the extinction period in addition to the holes generated in the light period. On the other hand, the region 32 ideally includes the electrons generated only in the light period because the electrons of the region 32 are disposed of into the region 34a before the light period. At this point in time, because the electrode 26 is applied with the negative potential, the region 32 as shown in FIG. 2B is low potential (potential well) to the electrons, while the region 33 is low potential (potential well) to the holes. As a result, the electrons and holes are not given to the recombination to be held and separated at the regions 32 and 33, respectively.

In short, by applying a suitable potential to the electrode 26, it is possible to gather and separate the generated electrons and holes at the regions 32 and 33 respectively. The electrode 26 and the regions 32, 33 functions as a carrier separation unit 12 (see FIG. 4) which separates the electrons and holes. The electrode 26 functions as a separation control electrode.

The electrode 26 is then applied with the positive potential. At this time, a potential difference between the regions 32, 33 is small (i.e., potential barrier is low). Therefore, the holes are pushed out from the region 33 to be given to the recombination with the electrons at the region 31 (mainly the region 32). Also, the electrons move from the region 32 to the region 33, and then are given to the recombination with the holes which are captured at the region 33 of proximity to interface between the layer 24 and the region 33. The recombination depends on conditions such as the electric potential applied to the electrode 26 in order to control electric potential to the electrons and holes, a period of time which the electric potential is applied to the electrode 26, impurity concentration of the semiconductor which constitutes the regions 31, 33, or the like. By controlling the electric potential applied to the electrode 26, the recombination of the electrons and holes is stimulated, and therefore the electrode 26 functions as a recombination control electrode. Because the recombination occurs at the region 31, the region 31 functions as a recombination unit 15 (see FIG. 4).

Expanding upon the above, in the first embodiment, the number of the electrons is adjusted so as to be larger than the number of the holes before the recombination between the electrons of the region 32 and the holes of the region 33. Then, after the recombination, the holes disappear, while the electrons remain. The remaining electrons are the electrons generated at the region 31 in the light period. Therefore, by picking out the remaining electrons, it is possible to eliminate influence of the ambient light to pick out the charges (signal charges) of which the number is in proportion to the input signal light. After the electrode 26 is applied with the positive potential to stimulate the recombination of the electrons and holes, the electrode 26 is applied with the negative potential. Then, the remaining electrons are gathered at the region 32.

Then, the electrons of the region 32 are picked out as the signal charges. Namely, when the electrons are kept at the region 32, the electrode 27 is applied with the positive potential. Then, because a channel is formed between the regions 31, 36 in the layer 22, the electrons of the region 32 move to the region 36 through the channel. The electrons of the region 36 are issued to external based on, for example, well-known technology of charge transfer utilized in the CCD image sensor or the like.

Summarizing above, the unit 10 controls timing for applying the electric potential to the electrodes 25, 26, 27, 34b, 35b. In the extinction period, the electrode 25 is applied with the positive potential, while the electrode 26 is applied with the negative potential. When the element 1 receives the input light, electrons and holes are generated at the substrate 21, the region 22, the layer 23 and regions 31, 33 by photo excitation. The electrode 35a is applied with the positive potential while the electrons and holes are kept at the regions 32 and 33 respectively. Then, the holes generated in the extinction period remain at the region 33, while the electrons generated in the extinction period move to the region 34a to make the region 32 empty.

In the light period, the electrode 25 is applied with the positive potential, while the electrode 26 is applied with the negative potential, as well as the extinction period. When the element 1 receives the input light, electrons and holes are generated at the substrate 21, the region 22, the layer 23 and regions 31, 33 by photo excitation. The region 33 includes not only the holes generated in the light period but also the holes generated in the extinction period. The region 32 includes the electrons generated only in the light period.

After this operation, the electrode 26 is applied with the positive potential. Then, because the potential difference between the regions 32, 33 is small, the holes of the region 33 move to the region 32 to be given to the recombination with the electrons. Also, the electrons of the region 32 move to the region 33 to be given to the recombination with the holes. When the electrons are held at the region 32, the gate 27 is applied with the positive potential. Then, because the channel is formed between the regions 31, 36 in the layer 22, the electrons of the region 32 move to the region 36. The electrons of the region 36 are issued to external.

Referring to the FIG. 4, each unit of the element 1 is explained. The photosensitive unit 11 corresponds to a region of the MIS device structure which includes the substrate 21, the layer 22 (incl. the region 31), the layer 24 and the electrode 25, and generates electrons and holes in response to light irradiation. As described above, the electrons and holes of the substrate 21 and layer 22 promptly disappear. Therefore, the electrons and holes generated at the region 31 are mainly equivalent to the electrons and holes generated in the unit 11.

After a ratio of the number of the electrons and holes generated at the unit 11 is adjusted at the unit 12, the holes and electrons are gathered at a hole holding unit 13 and an electron holding unit 14, respectively. In the first embodiment, because electron and hole are the object carrier and the non-object carrier, respectively, the unit 13 is a non-object carrier holding unit and corresponds to the region 33, while the unit 14 is an object carrier holding unit and corresponds to the region 32.

Expanding upon the above, the unit 12 gathers and separates the holes and electrons at the units 13 and 14, respectively. The unit 12 also controls a ratio of the number of the holes gathered at the unit 13 and the number of the electrons gathered at the unit 14. For example, the unit 12 adjusts so that the ratio becomes a ratio such as, for example, 1:2 (i.e., "holes":"electrons"=1:2) or the like. The ratio depends on element construction such as impurity concentration, dimension, shape, arrangement of the regions 32, 33, and difference of mobility of the electrons and holes. By controlling polarity of the electric potential applied to the electrode 26, the holes and electrons can be gathered and separated at the unit 13 and the unit 14, respectively. Also, the ratio can be controlled by changing level of the electric potential applied to the electrode 25, 26. Namely, because height of the potential barrier and depth of the potential well can be controlled by adjusting the level of the potential (voltage), it is possible to control the number of the holes gathered at the unit 13 and the number of the electrons gathered at the unit 14.

The number of the electrons gathered at the unit 14 is also adjusted by disposing of the electrons from the unit 14. By disposing of the electrons gathered at the unit 14 in the extinction period into a disposal unit 18 which is composed of the region 34a before the light period, it is possible to prevent mixture with the electrons gathered at the unit 14 in the light period. Timing for disposing of the electrons is controlled by ON-timing of a switch unit 17 which is composed of the electrode 35a. Namely, the electrons from the unit 14 can be disposed of by applying the positive potential to the electrode 35a in order to turn the unit 17 on. Thus, the electrons generated only from the ambient light are disposed of by disposing of the electrons held in the extinction period into the unit 18 through the unit 17. As a result, it is possible to reduce influence of the ambient light from the electrons remained after the recombination with the holes.

The holes and electrons gathered at the units 13 and 14 are given to the recombination at the unit 15. The unit 15 is composed of the regions 32, 33 and the electrode 26, and its recombination timing is controlled by timing for applying the positive potential to the electrode 26. Before the recombination, the electrons held at the unit 14 are almost generated in the light period. Therefore, by making the electrons remain after the recombination at the unit 15, it is possible to increase components of the input signal light in the electrons remained after the recombination as compared with a case of no recombination. The electrons remained at the unit 14 (region 32) after the recombination are picked out to external through the output unit 16 which is composed of the electrode 27 and the region 36. Operation timing of the units 12, 15, 16, 17 is controlled so as to synchronize with light and extinction state of the source 2 by the unit 10 which controls ON(light)/OFF (extinction) of the source 2.

As described above, in order to make the electrons remain after the recombination at the unit 15, it is necessary that the number of the electrons held at the unit 14 is larger than that of the holes held at the unit 13 before the recombination. This condition is satisfied by making the electrons gathered at the unit 14 larger than the holes gathered at the unit 13 in the unit 12. Also, in order to remove components of the ambient light from the electrons picked out from the unit 15, it is desirable that the ratio of the number of the electrons and holes gathered at the units 14 and 13 is related to a ratio of the extinction period and the light period, respectively.

These conditions are explained. If the unit 12 provides the unit 14 with electrons of which the number is "aIt" when the unit 11 receives light with strength "I" during time "t", the number "$N_E$" of the electrons gathered at the unit 14 in the light period is given by $$N_E = a(Ia+Ib)t_2$$

where "Ia" is strength of the input signal light, "Ib" is strength of the ambient light, and "$t_2$" is the light period.

The number "$N_H$" of the holes gathered at the unit 13 in the extinction period and light period is given by $$N_H = ka\{Ibt_1 + (Ia+Ib)t_2\}$$

where "k" is scale factor of the number of the electrons which equals the number of the holes picked out of the unit 12 (i.e., the number of the holes is "k" times of the number of the electrons), and "$t_1$" is the extinction period.

Therefore, when satisfying ideal conditions, the number "N" of the electrons picked out from the unit 15 is $$N = a(Ia+Ib)t_2 \cdot ka\{Ibt_1 + (Ia+Ib)t_2\} \qquad (1)$$

where all electrons held at the unit 14 in the extinction period are disposed of into the unit 18, while all holes of the unit 13 are given to the recombination with the electrons of the unit 14, as the above-mentioned ideal conditions. Because the number "N" must be a positive number, "k" is smaller than "1" (k<1).

After changing the function formula (1) into formula which consists of term enclosed by "Ia" and term enclosed by "Ib", condition for making "Ib" "0" is calculated as $$t_1 = \{(1-k)/k\}t_2.$$

Figure 5:
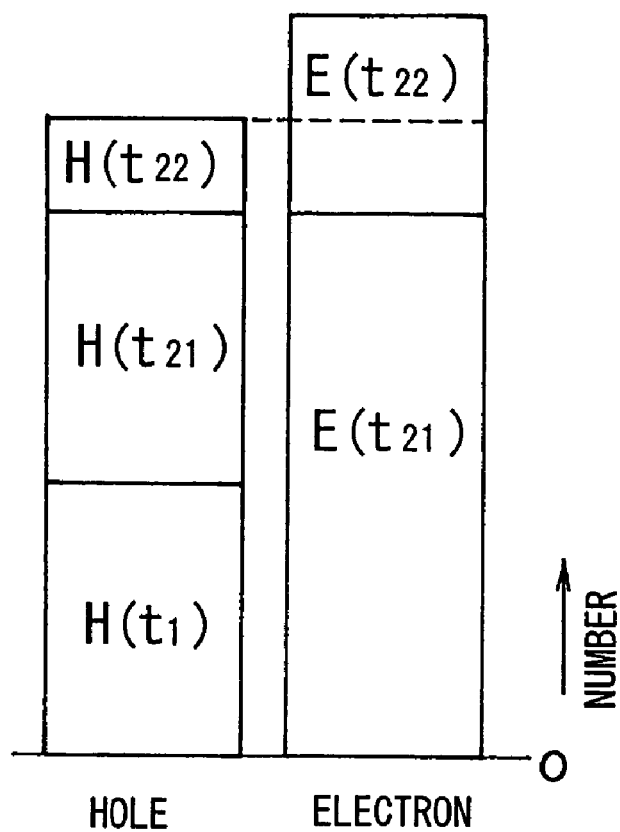

If adjusting a ratio of "$t_1$" and "$t_2$" according to "k", it is possible to eliminate the components of the ambient light to pick out only the components of the input signal light. If $t_1:t_2$ is set to 1:1, "k" is 0.5 (k=0.5). In this case, when the number of the electrons is set to twice of the number of the holes by the unit 12, it is possible to eliminate the components of the ambient light to pick out only the components of the input signal light. In this condition, the number of electrons $E(t_{21})$ generated by the ambient light in the light period "$t_2$" as shown in FIG. 5 equals sum of the number of the holes $H(t_1)$ generated by the ambient light in the extinction period "$t_1$" and the number of the holes $H(t_{21})$ generated by the ambient light in the light period. Therefore, the electrons $E(t_{21})$ and the sum $(H(t_1)+H(t_{21}))$ cancels each other.

Also, the number of the electrons $E(t_{22})$ generated by the input signal light in the light period is twice of the number of the holes $H(t_{22})$ generated by the input signal light in the light period. Therefore, the number of the remaining electrons is half of the number of the electrons $E(t_{22})$ after the recombination. As a result, with reference to the electrons (object carriers) after the recombination, only components of the input signal light results in remaining.

Effect of the unit 18 is explained. It is supposed to be satisfied function of $$Qa = A \cdot Qb$$

where "Qa" (Qa=β·Ia) is charge quantity of the electrons held at the unit 14, "A", "β" are proportional constant, "Qb" (Qb=β·Ib) is charge quantity of the holes held at the unit 13, the extinction period equals the light period, and strength of the ambient light is fixed in the both periods.

It is also supposed that the unit 17 is turned on while being shifted from the extinction period to the light period in order to dispose of the electrons from the unit 14, and the unit 17 is turned off in the light period in order to gather the electrons at the unit 14.

Under these conditions, the electrons held at the unit 14 in the extinction period are disposed of at a point (preferably, immediate point) in time before being shifted to the light period. As a result, it is possible to prevent mixture of the electrons generated in the extinction period and the electrons generated in the light period. In another example, the unit 17 is kept to off while being shifted from the light period to the extinction period since the mixture during the shift is permitted.

In case of omission of the unit 18, charge quantity of the object carriers and the non-object carriers held in the extinction period are A·β·Ib and β·Ib respectively. Also, charge quantity of the electrons gathered at the unit 14 and the holes gathered at the unit 13 in the light period are A β(Ia+Ib) and β(Ia+Ib) respectively. Therefore, charge quantity of the electrons remained after the recombination is given by A·β(Ia+2Ib)−β(Ia+2Ib). After calculating the function formula based on the strength Ia, Ib, β{(A−1)Ia+(2A−2)Ib} is obtained.

In the first embodiment with the unit 18, only the holes are held at the unit 13 immediate before the light period, and the charge quantity is given by β·Ib. Charge quantity of the electrons and holes gathered at unit 14 in the light period are given by A·B(Ia+Ib) and β(Ia+Ib), respectively. Therefore, charge quantity of the electrons remained after the recombination is given by A·β(Ia+Ib)−β(Ia+2Ib). After calculating the function formula based on the strength Ia, Ib, β{(A−1)Ia+(A−2)Ib} is obtained.

Therefore, it is found that the element 1 can reduce influence of the ambient light as compared with the case without the unit 18 because a coefficient for the ambient light in the element 1 is smaller by A·β than that in the case. For example, in case of A=2, the charge quantity remained after the recombination is given by β(Ia+2Ib) in the case, while the charge quantity is given by β·Ia in the element 1 so that it is possible to pick out the electrons without the influence of the ambient light. Under condition that "extinction period":"light period" is 1:1, A=2 is equivalent that the "k" at the unit 12 is 0.5.

Control of charge transfer from the unit 15 is explained. In order to obtain the electrons of the input signal light at the unit 15, it is necessary to be satisfied that strength of the ambient light is substantially fixed in the extinction period and the light period. In order to satisfy the condition, it is required that the extinction period and the light period are changed over within a time period so as not to occur fluctuation of the strength of the ambient light in the both periods. Because such time period is a comparatively short time period, the number of the generated electrons and holes are few. Therefore, if the electrons are gathered by one extinction period and one light period, the number of the electrons transferred to the region 36 is very low as compared with the number of the electrons corresponding to the ambient light in the light period. Also, when the ambient light has a large strength, it is necessary to shorten the light receiving time (extinction and light-periods) so as not to cause saturation to occur at the regions 32, 33. In this case, there is a fear that the SN ratio is reduced by influence of the shot nose because the number of the electrons which remain after the recombination becomes few.

In order to increase signal charge, it is desirable to accumulate (integrate) electrons by plural cycles of the extinction period and the light period at the region 36 instead of immediately picking out the electric charge transferred to the region 36. Namely, it is desirable to hold the electrons at the region 36 by repeating a series of operations for stimulating the recombination after the extinction period and the light period, and for holding and transferring the electrons to the region 36. As a result, it is possible to almost eliminate the components of the ambient light to integrate only the electrons corresponding to the input signal light. In short, when there is a possibility of occurring saturation at the regions 32, 33 by long exposure time under large strength of the input light, it is possible to pick out comparatively large signal charge by shortening time of one extinction period and one light period and increasing the number of integration (repetition). As a result, reduction of SN ratio by influence of the shot nose can be prevented.

In this operation, there is a possibility that the strength of the ambient light fluctuates while repeating the extinction period and the light period, and accumulating each electrons at the region 36. However, if the strength of the ambient light is substantially fixed in each extinction period and each light period, the fluctuating components of the ambient light is cancelled. Therefore, the output is not influenced by the fluctuation of the strength of the ambient light even though the extinction period and the light period are alternately repeated at plural times.

Figure 6:
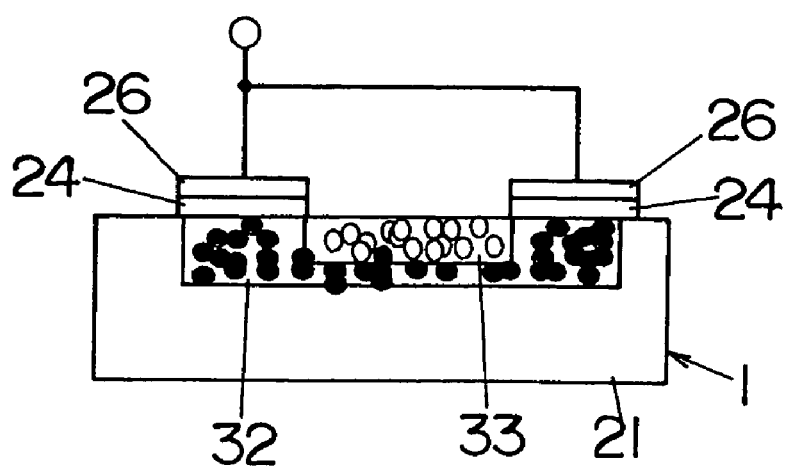
FIG. 6 shows an alternate embodiment of the light detecting element according to the present invention.

In an alternate embodiment of the light detecting element, the control electrode 26 as shown in FIG. 6 is located on the electron holding region 32 through the insulating layer 24. In FIG. 6, the electrode 26 is formed so as to encircle the region 33 at surface side of the region 32. In this structure, the electrode 26 is applied with the positive potential on gathering electrons and holes at regions 32 and 33 respectively, while the electrode 26 is applied with the negative potential on the recombination of the electrons and holes.

In another alternate embodiment of the light detecting element, the timing control unit 10 controls electric potential applied to the substrate 21 in order to lower the potential barrier (for electrons) between the regions 32, 33, instead of controlling the electric potential applied to the control electrode 26. In this construction, it is possible to stimulate the recombination by controlling the electric potential applied to the substrate 21 to control the height of the potential barrier. In case of this, the electron holding region 32 can be also used as the recombination unit 15. Moreover, the control is simple because it is possible to select a state of holding the electrons and holes or a state of the recombination only by controlling the electric potential applied to the substrate 21.

In another alternate embodiment of the light detecting element, the electron holding region 32 is formed within the hole holding region 33 even in case the object carrier is the electron.

In another alternate embodiment of the light detecting element, the recombination is stimulated at the hole holding region 33 which holds the holes (non-object carriers).

In another alternate embodiment of the light detecting element, the surface electrode 25 as well as the control electrode 26 is used as the carrier separation unit 12. In this construction, when electric potential applied to the electrode 25 is sufficiently high in the light period, the region 32 functions as a potential barrier for the holes which generate the depths of the substrate 21. Therefore, the holes generated the depths can be prevented to be accumulated at the region 33. It is also possible to prevent disappearance by the recombination between a part of the electrons generated in the light period and the holes generated in the light period.

In another alternate embodiment of the light detecting element, "holes":"electrons" generated at the photosensitive unit 11 is 1:1. The region 32 holds only electrons generated in the light period because the electrons generated in the extinction period are disposed of into the region 34a. Only the holes generated in the extinction period are used for the recombination since the holes generated in the light period are not given to the recombination with the electrons of the region 32. The recombination is substantially occurred by the holes H(t1) generated by the ambient light in the extinction period and the electrons (E(t21)+E(t22)) generated by the ambient light and the input signal in the light period. Therefore, when H(t1) equals H(t21), only the electrons (E(t22)) corresponding to the input light signal can be remained after the recombination by setting "holes":"electrons" to 1:1.

The distance sensor is explained. Strength fluctuation of the signal light is utilized in order to measure the distance between the distance sensor and the physical object 3. The sensor detects a phase difference between the modulation signal for modulating the output signal light and modulation components included in the input signal light. The modulation signal is formed by, for example, a sine wave.

Figure 7:
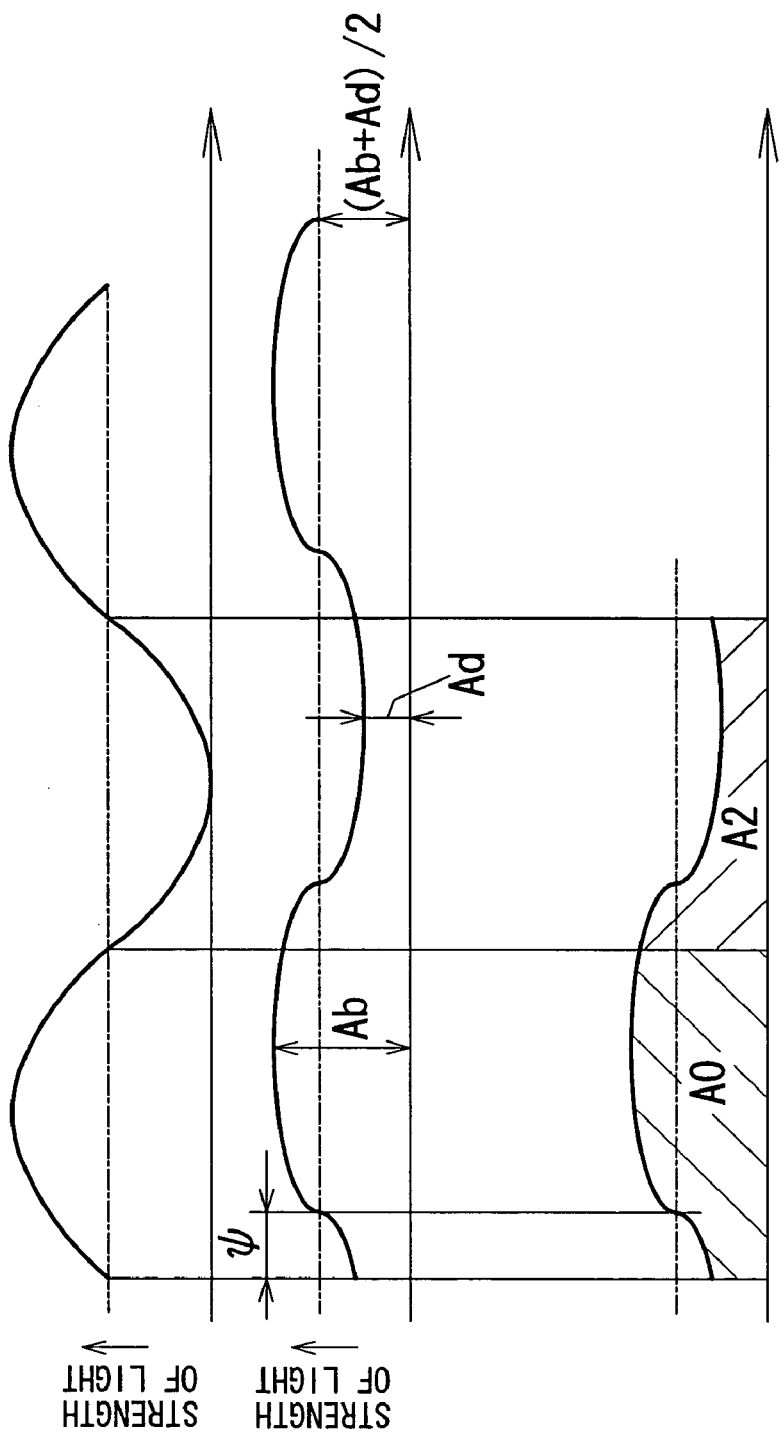
FIGS. 7A-7D show an alternate embodiment of the distance sensor equipped with the light detecting element according to the present invention.

Two methods in order to get the phase difference $\psi$ as shown in FIG. 7 are explained. In the first method, the quantity of the light received by the element 1 is utilized, and the quantity is obtained by timing corresponding to plural phases which synchronize with the modification signal. In the second method, the quantity of the light received by the element 1 is also utilized, but the quantity is obtained by plural timing which does not synchronize with the modification signal.

The first method is explained. Top (left end) of a section (detection window) which consists of a phase angle of 180° is set at an initial phase angle of the modification signal, and then the section is shifted by 90° along the time axis whenever the phase angle of the modification signal changes by 90°. The quantity of the light received by the element 1 is detected during each of the shifted sections. For example, the quantity as shown in FIG. 7C, 7D is detected during each of 4 sections respectively corresponding to phase angle range 0 to 180° (A0), 90 to 270° (A1), 180 to 360° (A2) and 270 to 90° (A3) of the modification signal. In FIG. 7B, "Ab" is maximum of strength of the light received by the element 1, and "Ad" is minimum of the strength. The "Ad" is equivalent to the strength of the ambient light received by the element 1. Also, "$\psi$" (unit is radian) is the phase difference between the output signal light and the input signal light (L=$\psi$·c/2$\omega$ where "L" [m] is the distance between the distance sensor and the physical object 3, and "c" is speed of light [m/s]).

The strength of the light received by the element 1 is given as a function of phase angle $\theta$ by g($\theta$)=(Ab−Ad)sin $\theta$+(Ab+Ad)/2. In this case, the quantity of the section corresponding to 0-180° and the quantity of the section corresponding to 180-360° are equivalent to area of the "A0" and the "A2" in FIG. 7C respectively. Also, the quantity of the section corresponding to 90-270° and the quantity of the section corresponding to 270-90° are equivalent to area of the "A1" and the "A3" in FIG. 7D, respectively. Therefore, the "A0", "A1", "A2" and "A3" are given by $A0=\int g(\theta)d\theta [-\psi, 180°-\psi]$ $A1=\int g(\theta)d\theta [90°-\psi, 270°-\psi]$ $A2=\int g(\theta)d\theta [180°-\psi, 360°-\psi]$, and $A3=\int g(\theta)d\theta [270°-\psi, 90°-\psi]$ where phase "$\theta$" is a function of time "t" and given by $\theta$=$\omega$t ($\omega$=2$\pi$f, "f" is modification frequency), and content within the square brackets represents the section.

Let "Aa" be Ab-Ad and "Ac" be (Ab+Ad)/2. Then, the "A0", "A1", "A2" and "A3" are changed into $A0=-2Aa\cdot\cos\psi+Ac\cdot\pi$ $A1=-2Aa\cdot\sin\psi+Ac\cdot\pi$ $A2=2Aa\cdot\cos\psi+Ac\cdot\pi$, and $A3=2Aa\cdot\sin\psi+Ac\cdot\pi$.

Therefore, since tan $\psi$ is obtained when calculating (A1−A3)/(A0−A2), the phase difference $\psi$ is given as formula (2) by $$\psi=\tan^{-1}(A1-A3)/(A0-A2). \qquad (2)$$

When the wave form of the modification signal is the sine wave, the phase difference $\psi$ can be calculated by the formula (2) and therefore the distance "L" can be calculated.

In order to obtain each quantity of light corresponding to the sections "A0"-"A3" from the element 1, it is necessary to repeat a combination period of the light period and the extinction period. Any quantity of light corresponding to the sections "A0"-"A3" is picked out in each different combination period. Therefore, the combination period is repeated at least four times in order to get the phase difference $\psi$.

In order to pick up any quantity of light corresponding to the sections "A0"-"A3" from each different combination period, it is necessary to control sensitivity of the element 1. For example, when detecting the quantity of light corresponding to the section "A0" from certain combination period, the sensitivity to the section "A0" is set to be higher than that for the other sections "A1"-"A3" in the combination period. In order to control the sensitivity, it is necessary to arrange a plurality of the electrode 25 along normal to the plane of FIG. 1 and control the electric potential (voltage) pattern for an electrode-set which is constructed with plural (e.g., more than 3) electrodes 25. By controlling the electric potential applied to each electrode 25, it is possible to control the depth of the potential well formed at the region 31 facing the electrode 25. Therefore, the potential pattern applied to a part of the electrode-set and the potential pattern applied to all of the electrode-set are changed over. Each potential pattern is applied in order to form a deep potential well at corresponding part. As a result, because the area for receiving the input light is adjusted (changed), the sensitivity can be adjusted.

The second method is explained. In case of this, a beat signal is utilized. When mixing fluctuation signal of the quantity of light received by the element 1 with a signal which has a different frequency from the modification frequency, the beat signal whose amplitude vibrates in response to difference frequency between the both signals is obtained. Because the envelope curve of the beat signal involves the phase difference $\psi$, the difference $\psi$ can be obtained by picking out the quantity of the input light corresponding to the envelope curve based on the different phase of the envelope curve. For example, quantity A0', A1', A2', A3' of the input light is obtained by integrating quantity of the sections of phase angle range 0-180°, 90-270°, 180-360°, 270-90° in the envelope curve respectively. Then, the phase difference ψ can be obtained by substituting A0', A1', A2', A3' for A0, A1, A2, A3 of the formula (2).

The beat signal is obtained by controlling the electric potential applied to the electrode 25 by a local oscillator signal with different frequency from that of the modulation signal, and a mixing circuit is constructed with the units 13-14. When the local oscillator signal is utilized as the means for holding and recombination of the electrons and holes, quantity of the electrons which remain after the recombination is equivalent to amplitude of the beat signal. Therefore, an output corresponding to the received light can be obtained in response to the amplitude of the beat signal.

Figure 8:
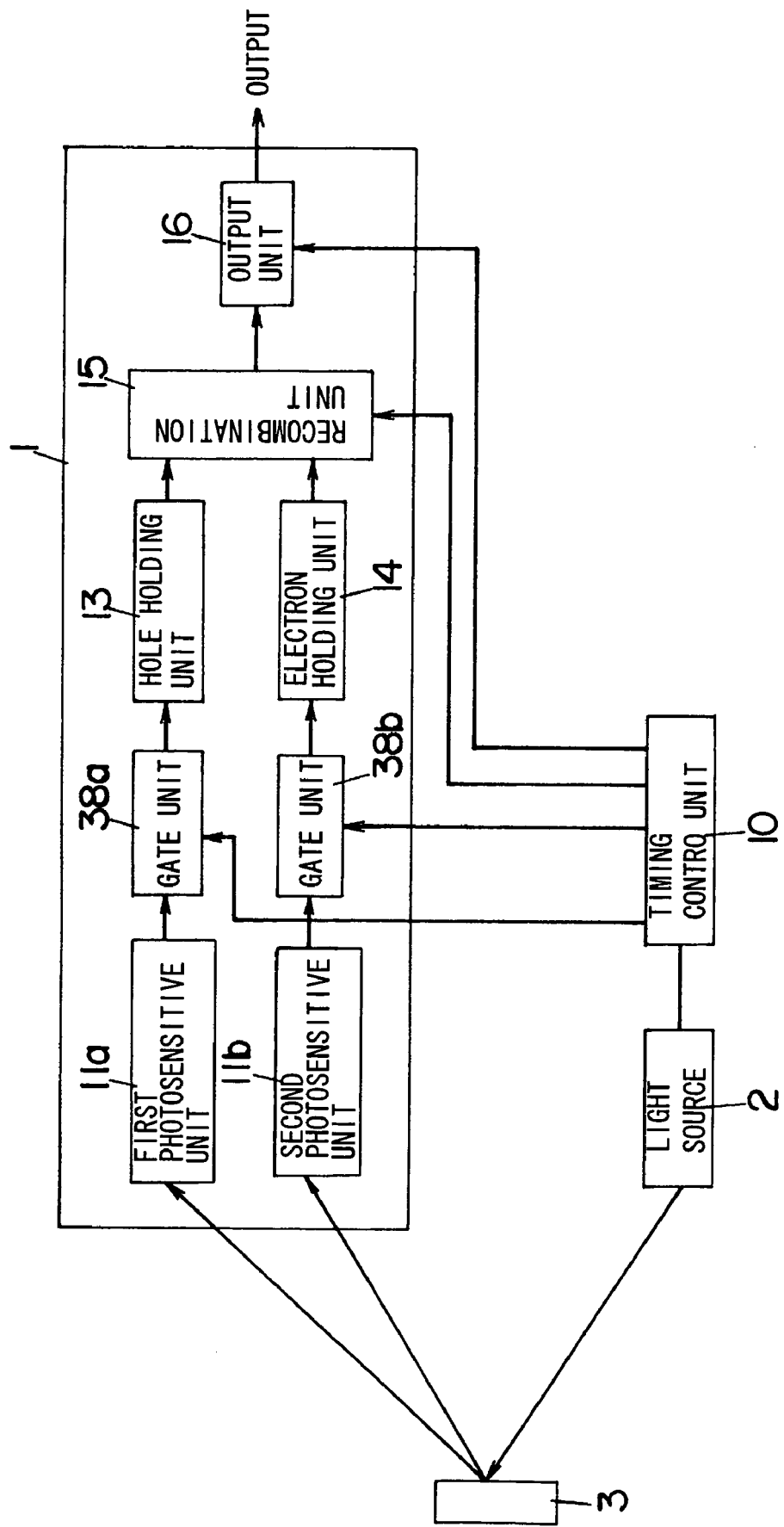
FIG. 8 is a principal block diagram of a distance sensor equipped with a light detecting element of a second embodiment according to the present invention.

FIG. 8 shows a distance sensor equipped with a light detecting element 1 of a second embodiment according to the present invention. In the second embodiment, the object carriers corresponding to the input signal light are picked out by a difference between the input light in the extinction period and the input light in the light period. Namely, only the non-object carriers are held in the extinction period, while only the object carriers are held in the light period. Therefore, it is unnecessary to adjust the ratio of the number of the carriers held at the units 13, 14.

The element 1 of the second embodiment comprises a first photosensitive unit 11a which has suitable structure for picking out the holes and a second photosensitive unit 11b which has suitable structure for picking out the electrons. When the units 11a, 11b have a structure of PN junction type or PIN type photodiode, it is possible to realize by reversing conductive type of the semiconductor. Also, in case of the MIS structure, it is possible to realize by reversing the conductive type of the semiconductor and setting the electric potential applied to the gates to different polarities.

The holes generated at the unit 11a are held at the unit 13 through a gate unit 38a, while the electrons generated at the unit 11b are held at the unit 14 through a gate unit 38b. Timing for holding the holes at the unit 13 through the unit 38a is different from that for holding the electrons at the unit 14 through the unit 38b. The unit 10 of the second embodiment controls so as to selectively open one of the units 38a, 38b. The units 38a, 38b can be realized by the MOS structure as well as the gate 27 of the first embodiment. The unit 10 of the second embodiment can selectively open one of the units 38a, 38b by controlling the applied electric potential. In the second embodiment, the holes held at the unit 13 and the electrons held at the unit 14 are recombined at the unit 15, and then the carriers remained after the recombination are picked out as the object carriers through the unit 16, as well as the first embodiment.

In the second embodiment, the switch unit 17 and the disposal unit 18 are omitted, and the element 1 further comprises the units 11a, 11b and units 38a, 38b corresponding to the units 11a, 11b respectively, as compared with the first embodiment. The number of holes gathered at the unit 13 and the number of the electrons gathered at the unit 14 are adjusted by the units 13, 14, 38a, 38b. Therefore, the units 38a, 38b functions as a carrier separation unit for adjusting the number of the holes gathered at the unit 13 and the number of the electrons gathered at the unit 14 while separating the electrons and the holes.

In an alternate example, one photosensitive unit is included to generate the electrons and the holes, and the units 38a, 38b are controlled so that the unit 13 gathers only the holes from the photosensitive unit, while the unit 14 gathers only electrons from the photosensitive unit. In this construction, the photosensitive unit is shared by the units 13, 14.

The operation of the second embodiment is now explained. First, electrons are utilized as the object carriers. In the extinction period, only the ambient light is received at the units 11a, 11b. Because it is unnecessary to hold the object carriers, the holes generated at the unit 11a are held at the unit 13 by opening and closing the units 38a and 38b, respectively. In the light period, the electrons generated at the unit 11b are held at the unit 14 by closing and opening the units 38a and 38b respectively. Namely, the unit 10 opens and closes the units 38a, 38b so as to synchronize with the output signal light of the source 2. Then, the electrons held at the unit 14 corresponds to quantity of light which consists of the ambient light and the input signal light. When "extinction period":"light period" is set to 1:1, and the extinction period and the light period are set to time so as not to occur fluctuation of quantity of the ambient light, only the electrons remains after the recombination at the unit 15, and the number of the electrons represents the quantity of the input signal light.

In the first embodiment, because the region 31 with regions 32, 33 is shared with the unit 11 and the units 13, 14, the units 13, 14 cannot hold the electrons and the holes generated in the combination periods each of which consists of the extinction period and the light period. Therefore, when holding the carriers generated in the combination periods, it is necessary to stimulate the recombination of the carriers after one extinction period and one light period to accumulate (integrate) the object carriers after the recombination at the unit 16. On the other hand, in the second embodiment, it is possible to separately integrate the holes and the electrons before the recombination of the carriers by independent structure of the units 11a, 38a, 13 and the units 11b, 38b, 14. The recombination at the unit 15 can be stimulated after repeating the combination period at plural times and then holding the holes and the electrons at the units 13 and 14, respectively.

Also, in the first embodiment, because the non-object carriers generated in the light period involve the components of the input signal light, a part of the components in the object carriers disappears by the recombination of the components and the object carriers. Therefore, the number of the object carriers decreases so that sensitivity in response to the input signal light slightly decreases. On the other hand, in the second embodiment, the recombination is stimulated between the object carriers generated in the light period and the non-object carriers generated in the extinction period. Therefore, when setting "extinction period":"light period" to 1:1, the object carriers generated in response to the input signal light do not disappear by the recombination. As a result, the sensitivity to the input signal light is increased as compared with the construction of the first embodiment.

In an alternate embodiment of the light detecting element, the holes and the electrons are utilized as the object carriers and the non-object carriers, respectively.

Figure 9:
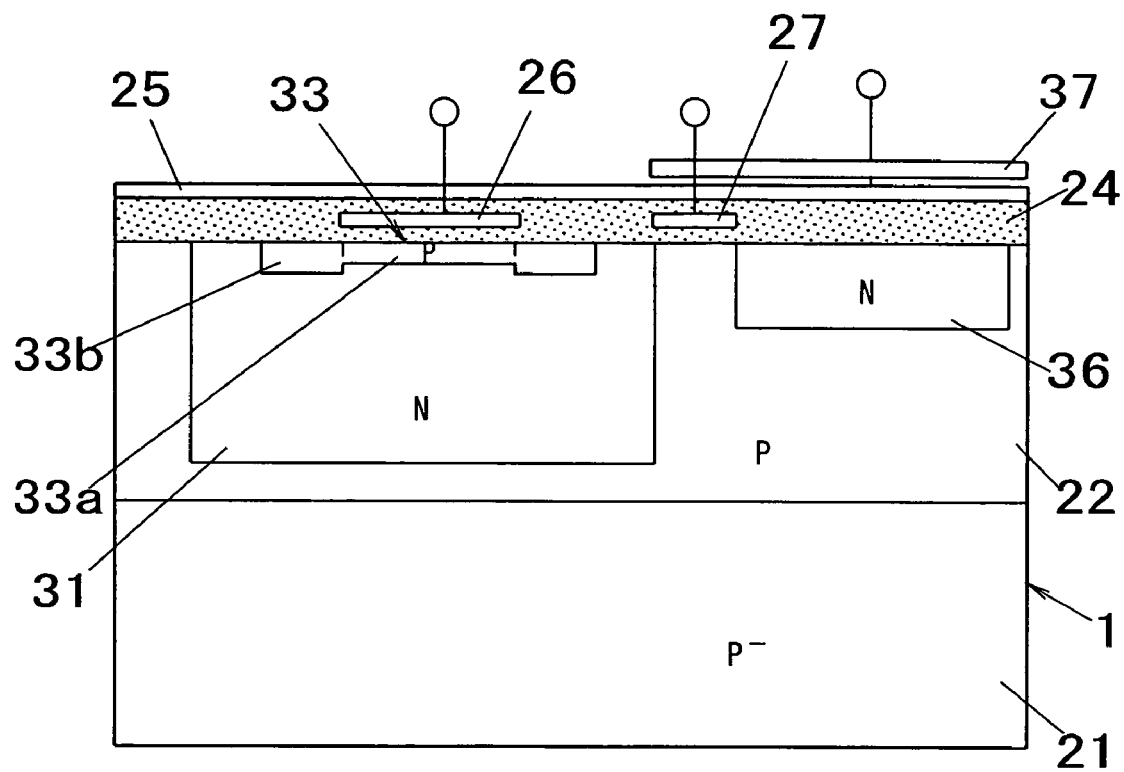
FIG. 9 is a sectional view of a light detecting element of a third embodiment according to the present invention, FIG. 10 describes the operation of the light detecting element of FIG. 9, FIG. 11 describes the operation of the light detecting element of FIG. 9.

FIG. 9 shows a light detecting element 1 of a third embodiment according to the present invention. In the third embodiment, the units 17, 18 and the region 32 are omitted as compared with the first embodiment, and the recombination of the holes and electrons is stimulated by drawing the electrons from the region 31 to the region 33.

In the element 1 of the third embodiment, a P-type (first conductive type) element formation layer 22 is formed on a main surface of a P-type semiconductor (e.g., silicon) substrate 21. The surface electrode 25 is formed on the main surface side of the layer 22 through the insulating layer 24 which is the oxidation layer (e.g., silicon oxidation layer). In the layer 24, the control electrode 26 and the gate electrode 27 are buried so as to be apart from the main surface of the layer 22, while the electrodes 26, 27 are spaced each other along the surface of the layer 22. The electrodes 25, 26 are translucent. The charge transfer region 36 is provided as well as the first embodiment.

Figure 10:
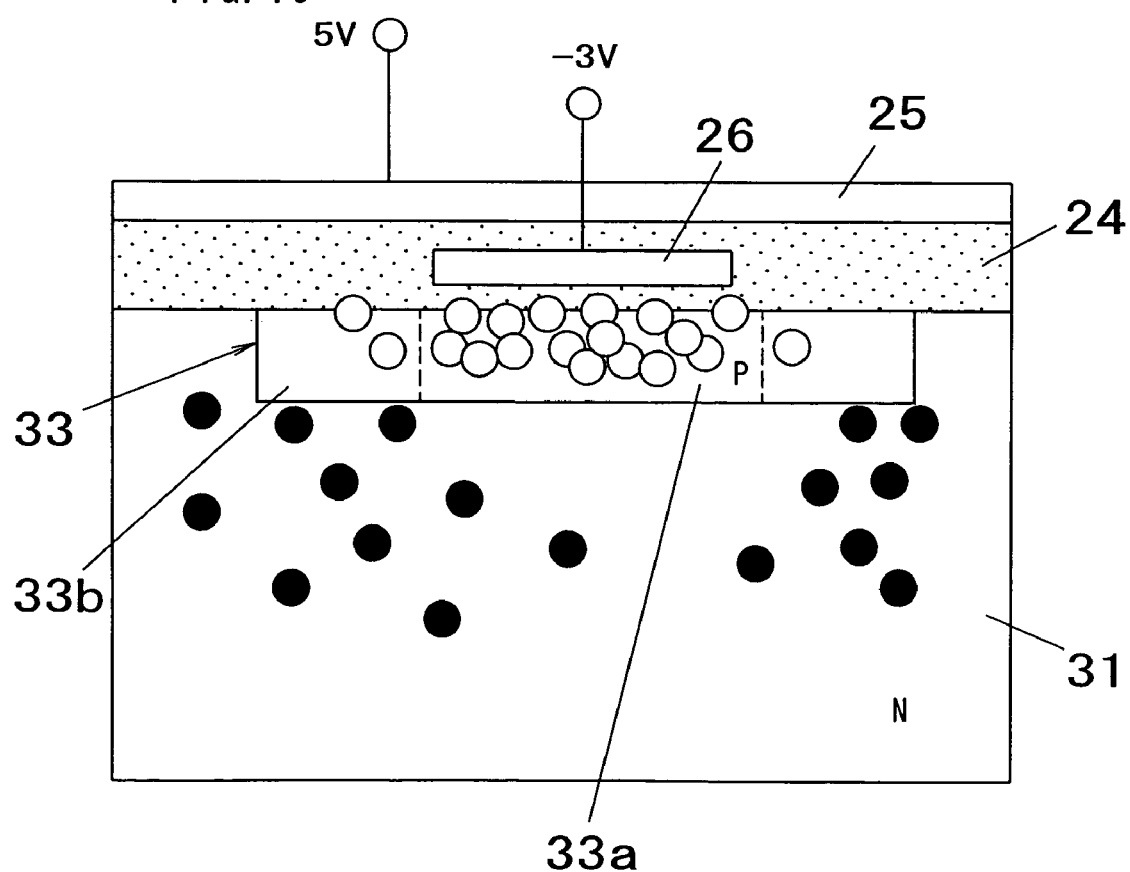

A N-type well region 31 is formed within the layer 22. In the main surface side within the layer 22, a P-type hole holding region 33 which functions as the unit 13 is formed so as to be encircled by the region 31. The region 33 holds and gathers the holes (non-object carriers) as a holding region. The area of the control electrode 26 is smaller than that of the region 33 in a plane view, and all bottom of the electrode 26 faces a part of the region 33. In the region 33, a region facing the electrode 26 is a gathering and recombination region 33a which functions as the units 14, 15, and the remaining region except the region 33a is a shunting region 33b for temporarily shunting holes. Light can be irradiated to the regions 31, 33, and electrons and holes are generated by photo excitation on light irradiation. The electrode 25 as shown in FIG. 10 is always applied with the positive potential by a positive voltage (e.g., 5V). In the light period, the electrode 26 is applied with the negative potential by a negative voltage (e.g., −3V) so as to hold the holes at the region 33. Then, the region 33 holds the holes generated in proximity to an interface between the regions 31, 33 by the light irradiation, while the region 31 holds the electrons generated in proximity to the interface.

The number of the electrons in recombination can be larger than that of the holes by controlling relation of thickness and area of the region 33, area of the region 31, and electro potential (voltage) applied to the electrode 26. Element structure is decided by its design, but the electrode 26 functions as the unit 12 by adjusting the number of the electrons held at the region 31 and the holes held at the region 33 based on the electric potential applied to the electrode 26. The regions 31, 33 function as the unit 11 because most of the electrons held at the region 31 and holes held at the region 33 are generated at the regions 31, 33.

In the third embodiment, the extinction period, the light period and the electric potential applied to the electrode 26 are appropriately adjusted, so that the number of the electrons held at the region 31 can be increased before the recombination as compared with the number of the holes held at the region 33. The electrons generated in the extinction period are not disposed of, but recombination can be stimulated between the electrons generated in the light period and the holes of which the number is equal or greater than that of the electrons generated in the extinction period, while the number of the electrons on the recombination can be greater than that of the holes. In short, it is possible eliminate the components of the ambient light while making the electrons remain after the recombination. FIG. 10 shows a state in which the electrons and holes are respectively held at the regions 31 and 33 after the extinction period and the light period, as described above.

Figure 11:
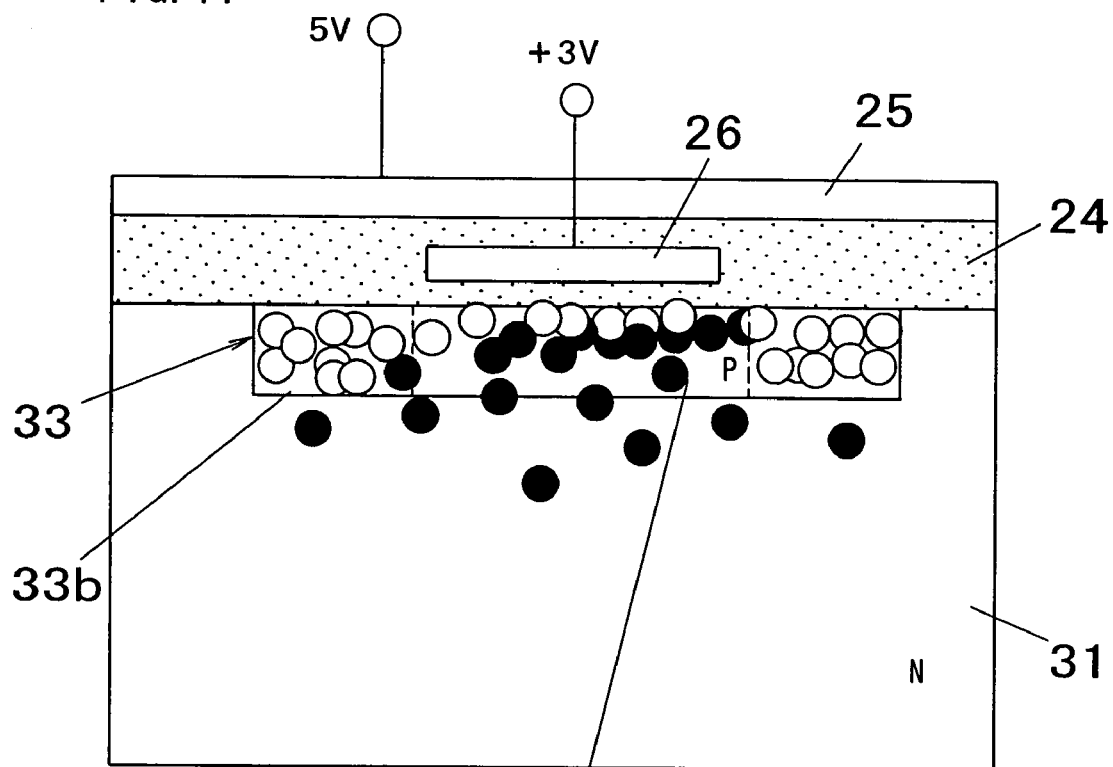

In the third embodiment, a combination control is repeated at plural times for the recombination of the electrons and holes. The combination control includes a control for applying the negative potential (e.g., voltage of −3V) to the electrode 26 as shown in FIG. 10, and a control for applying the positive potential (e.g., voltage of +3V) to the electrode 26 as shown in FIG. 11. The period of the recombination is sufficiently shorter than the extinction period and the light period, in which the polarity of the potential (voltage) is inverted at a few times by cycle of approximately $2 \times 10^{-8}$s. When the positive potential is applied to the electrode 26, the holes move from the region 33a to the region 33b, while the electrons move from the region 31 to the region 33a. At this time, because a part of the holes is trapped at the interface between the region 33 and the layer 24 by the potential of the interface, the trapped holes disappear by the recombination with the electrons. Also, a part of holes moves inside the region 33 to remain to be shunted at the region 33b.

Because an object of the recombination is to make holes disappear, it is necessary to make the holes shunted at the region 33b disappear. When the negative potential is again applied to the electrode 26, the holes shunted at the region 33b are drew to the region 33a, while the electrons mainly move to the region 31. By repeating such operation at plural times, the holes of the region 33 can be disappeared by the recombination. Also, because a portion of the electrons remains at a point in time which the holes disappear, the remaining electrons can be drawn to the region 33a by applying the positive potential to the electrode 26, while the electrons can be transferred from the region 33a to the region 36 by applying the positive potential to the electrode 27. Other constructing and operating are substantially the same as those in the first embodiment.

Figure 12:
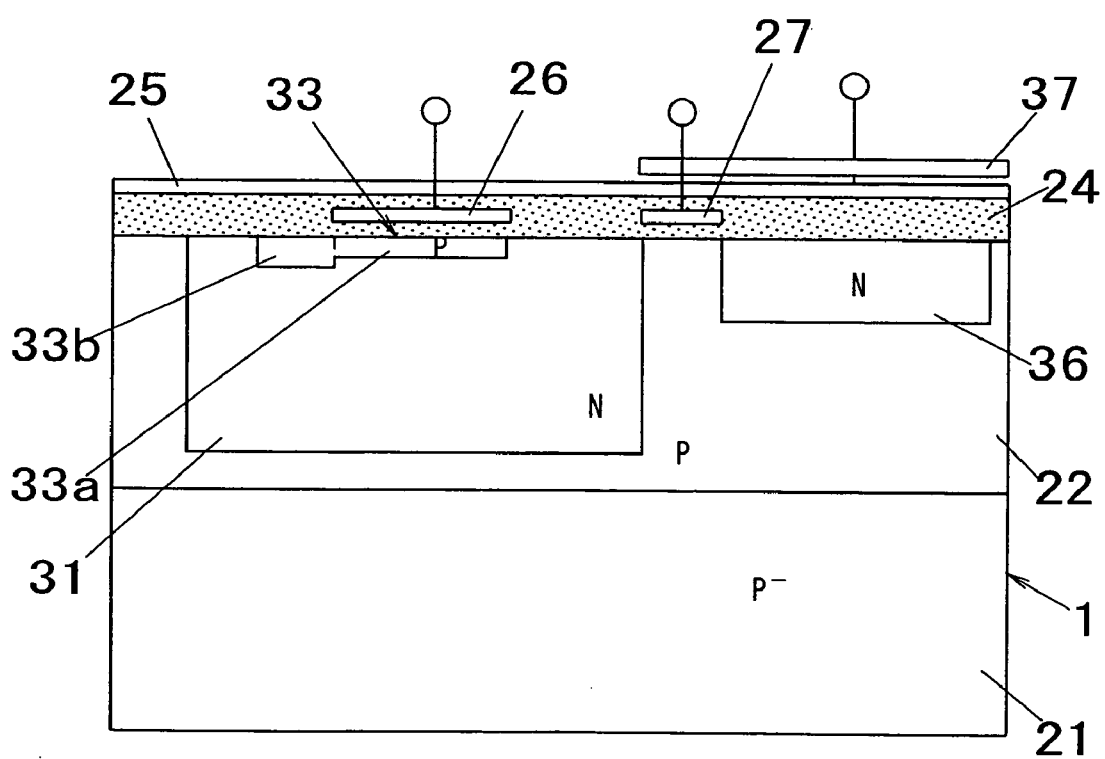
FIG. 12 shows an alternate embodiment of the light detecting element according to the present invention.

In an alternate embodiment of the light detecting element, the region 33b between the regions 33a, 36 is omitted as shown in FIG. 12 in order to solve a problem of the third embodiment. Namely, in the third embodiment, comparatively high potential to the electrode 27 is required for transferring the electrons from the region 33a to the region 36 due to the region 33b between the regions 33a, 36. In FIG. 12, the region 33b is formed into C-shaped or square shaped like a "C" in a plane view.

In another embodiment of the light detecting element, the region 33b is a high-concentration region in order to increase hole mobility between the regions 33a, 33b. For example, when the region 33a is a P-type region, the region 33b is formed as a P$^+$-type region.

Figure 13A:
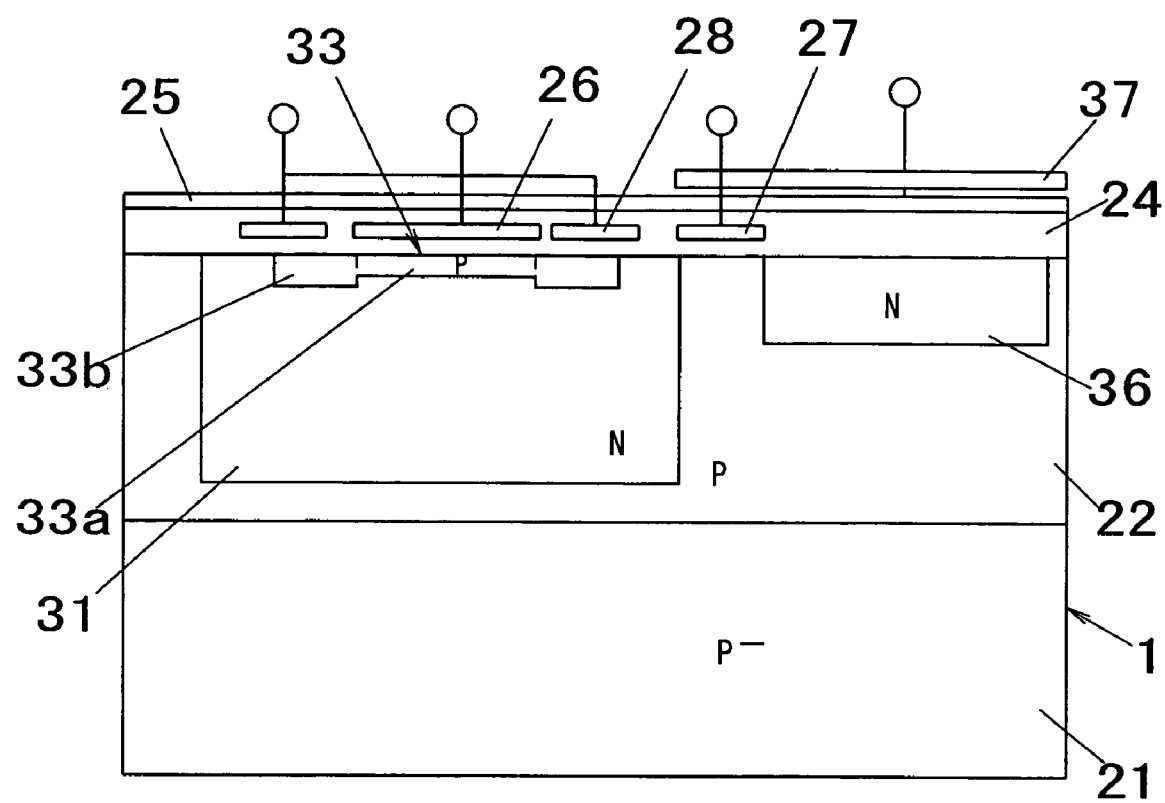
FIGS. 13A and 13B show other alternate embodiment of the light detecting element according to the present invention.
Figure 13B:
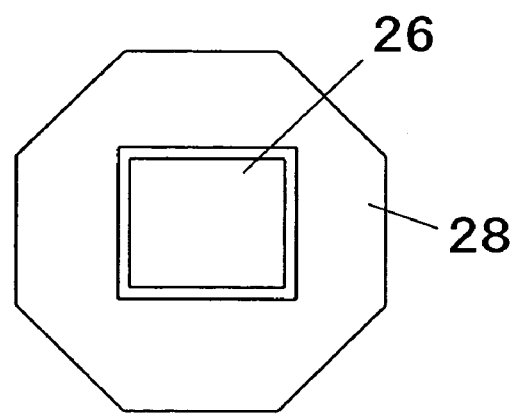

In another embodiment of the light detecting element, a shunting control electrode 28, as shown in FIG. 13A, 13B, is located around the electrode 26 to face the region 33b. The electrode 28 is provided instead of the above-mentioned high-concentration region. When holes are moved between the regions 33a, 33b, the hole mobility is increased by controlling the electric potential to the holes of the region 33b. Because the region 33b completely encircles the region 33a, the holes can be prevent from flowing out to the region 31. When the electrons are transferred from the region 33a to the region 36, the electron mobility can be increased by decreasing the electric potential to the electrons of the region 33b.

Figure 14:
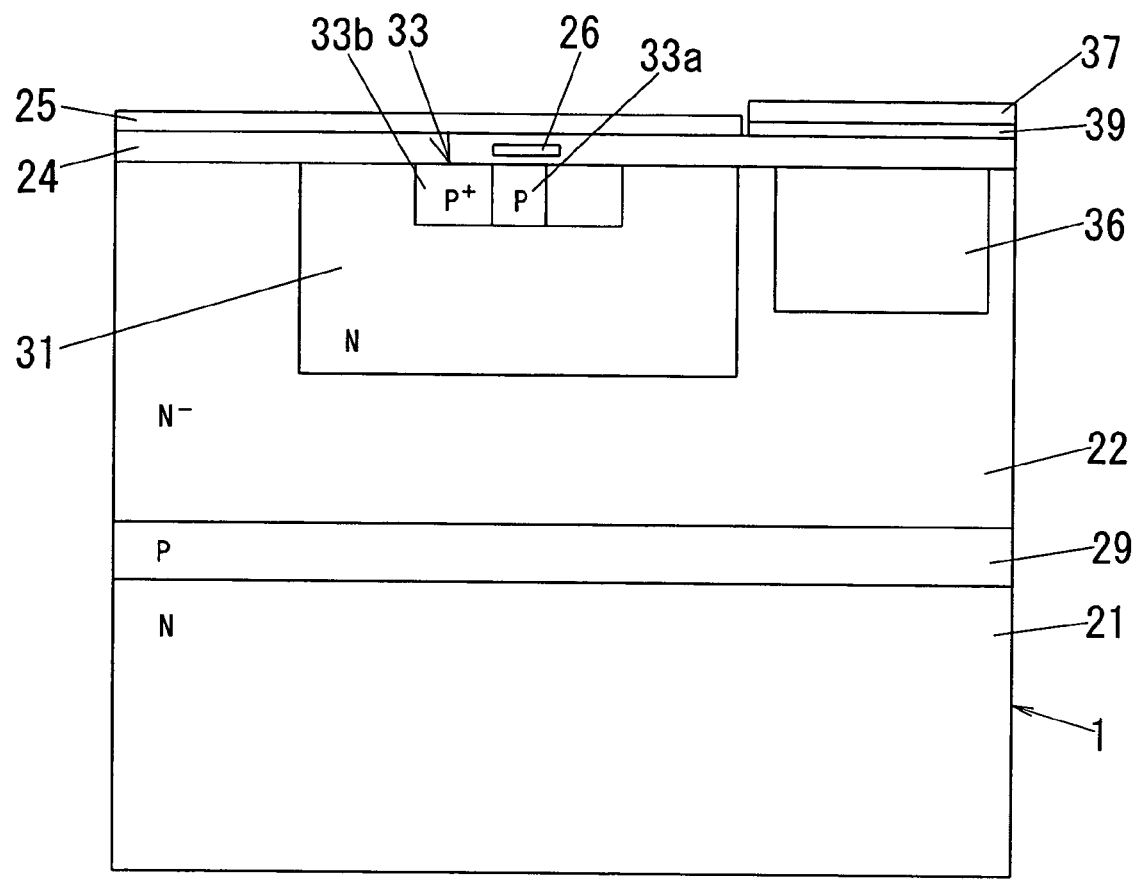
FIG. 14 is a sectional view of a light detecting element of a fourth embodiment according to the present invention.

FIG. 14 shows a light detecting element 1 of a fourth embodiment according to the present invention. In the element 1 of the fourth embodiment, the N-type well region 31 contains a P-type hole holding region 33 which functions as the hole holding unit 13 as well as the third embodiment. An N-type substrate 21 is provided instead of the P-type substrate of the third embodiment, while a N-type element formation layer 22 is formed instead of the P-type element formation layer 22 of the third embodiment. A P-type intermediate layer 29 is further formed between the substrate 21 and the layer 22, and set to the ground potential. In the hole holding region 33, the region 33a facing the electrode 26 is the P-type region as well as the third embodiment, but the region 33 contains a P$^+$-type shunting region 33b whose impurity concentration is increased.

In the fourth embodiment, there is no gate electrode 27 corresponding to the third embodiment, and the distance between the region 31 and the charge transfer region 36 is nearer than that of the third embodiment. The element 1 of the fourth embodiment also comprises a transfer electrode 39 facing the region 36 through the insulating layer 24. The electrons of the region 31 are transferred to the region 36 by changing electric potential (voltage) applied to the electrode 39. The electrode 39 is electrically separated from the surface electrode 25. The region 36 is covered by the shading film 37.

The element 1 comprises plural blocks shown in FIG. 14, and each block is arranged along normal to the plane of FIG. 14 so that two electrodes 39, 39 corresponds to one well region 31 in each block. In each block, one of the electrodes 39, 39 forms potential well for receiving electrons from the region 31, while another of them forms potential well for receiving the electrons from the potential well formed by the one of them. Namely, the element 1 is constructed as well as a vertical transfer register in the CCD image sensor of IT (interline transfer) system.

The number of the electrons and the number of the holes on the recombination are adjusted by controlling electric potential (voltage) applied to the substrate 21 in addition to the thickness and area of the region 33, the area of the region 31, and the electric potential applied to the electrode 26.

The operation of the fourth embodiment is now explained. The substrate 21 and the electrodes 25, 26 are applied with the positive potential or the negative potential. The electrode 39 is applied with high positive potential, low positive potential or the negative potential. The negative potential applied to the electrode 39 is utilized for transfer of electrons, but is not related to the following operation.

First, an initial state is explained. In the initial state, the holes of the region 31 disappear by the recombination with electrons, the electrons of the region 31 are transferred to the region 36, and the electrons of the other regions are disposed of through the substrate 21 or disappear by the recombination. Namely, the initial state is a state such that only electrons and holes of thermal equilibrium state exist in the substrate 21, the layer 22 (incl. the layer 31) and the layer 29. Such an initial state can be realized by utilizing the regions 34a, 34b shown in the first embodiment and the substrate 21 in order to dispose of the electrons and holes.

Next, the operation after the initial state is explained. The unit 10 controls the source 2 or the like so as to set the extinction period after the initial state. In the extinction period, the low positive potential is applied to electrode 39 so that the electrons and holes do not move from the region 31 to the region 36.

Also, the electrodes 25, 26 and the substrate 21 are respectively applied with the negative potential and the positive potential in order to shift to a first state. In the first state, the element 1 receives only the ambient light. Therefore, in the electrons and holes generated at the substrate 21 and the layers 22, 29, the electrons are disposed of through the substrate 21, while the holes move towards the electrode 25. In this case, because the region 33 contains the P-type region and the P+-region, the holes are mainly gathered at the region 33. As a result, the region 33 holds the holes of which the number corresponds to the holes generated in the extinction period.

When the extinction period is then changed over to the light period, the electrodes 25, 26 and the substrate 21 are respectively applied with the positive potential and the negative potential in order to shift a second state. In the second state, most of the holes of the region 33 are shunted at the region 33b, while a part of the holes remains at the region 33a by being trapped at the interface between the region 33 and the layer 24 by potential of the interface. Also, in the electrons and holes generated at the substrate 21 and the layers 22, 29, the electrons move toward the electrode 25, while the holes are disposed of through the substrate 21. The potential to the electrons becomes lowest at the region 31 except the region 33 due to difference of conductive type in the region 33, the region 31 except the region 33, and the region 22 except the region 31. Therefore, the region 31 mainly gathers the electrons corresponding to the ambient light and the input signal light, and a part of the electrons are given to the recombination with the holes remained at the region 33a. Because electron mobility is larger than hole mobility, the recombination is accomplished in a quite short time.

After a prescribed time (e.g., time necessary to substantially finish the recombination), only polarity of the potential applied to the electrode 26 is reversed to the negative potential while maintaining each potential applied to the electrode 25 and the substrate 21 in order to shift a third state. In the third state, the region 33 does not gather new (other) holes, while the region 31 gathers the electrons corresponding to the ambient light and the input signal light. Also, the holes of the region 33 are gathered at the region 33a, while the electrons are gathered at the region 31 except the region 33. The holes are gathered at the region 33a in a comparatively short time because the region 33 contains the P-type region and the P+-type region, and distance between them is short.

After a prescribed time (e.g., time necessary to substantially finish gathering the holes at the region 33a), only the potential applied to the electrode 26 is changed over to the positive potential in order to shift back to the second state. In this second state, a part of the electrons is given to the recombination with the holes which are trapped at the interface between the region 33a and the layer 24 by potential of the interface.

After this operation, the second state and the third state are alternately repeated at prescribed times (e.g., 2-3 times). The prescribed times are equivalent to the time necessary to make the holes which remain at the region 33 substantially disappear.

After an equivalent time to the prescribed times, the electrodes 25 and 39 are respectively applied with the negative potential and the high positive potential in order to shift from the third state to a fourth state. Namely, in the fourth state, only the potential applied to the electrode 39 differs from those of the third state. The high positive potential is set so that the electrons of the region 31 are transferred to the region 36. The electrons which remain at the region 31 include components obtained by reducing components of the ambient light and the input signal light by at least a part of the components of the ambient light. The electrons are picked out to the region 36 as signal charges.

After the fourth state, the source 2 is extinguished, while the negative potential and the positive potential are applied to electrodes 25, 26 and the substrate 21, respectively, in order to shift back to the first state. Other constructing and operating are substantially the same as those in the third embodiment.

Table 1 shows relation of electric potential applied to each electrode in the first to fourth states. In the Table 1, "High-P" is the high positive potential and "Low-P" is the low positive potential.

TABLE 1

| State | Period | Surface electrode | Control electrode | Substrate | Transfer electrode |
| --- | --- | --- | --- | --- | --- |
| First state | Extinction | Negative | Negative | Positive | Low-P |
| Second state | Light | Positive | Positive | Negative | Low-P |
| Third state | Light | Positive | Negative | Negative | Low-P |
| Fourth state | Light | Negative | Negative | Negative | High-P |

In the extinction period, there is only the first state. In the light period, there are the second to fourth states, and the second and third states are repeated at n-times before the fourth state (n>1). Therefore, by adjusting the time of the extinction period and the light period or adjusting the potential applied to each electrode, it is possible to harmonize the number of the holes gathered at the region 33 in the extinction period with the number of equivalent electrons to the ambient light in the electrons gathered at the region 31 in the light period. Also, an operation for shifting back to the initial state might be inserted between the light period and the extinction period as occasion arises.

In the fourth embodiment, by controlling the potential applied to the substrate 21 in addition to each potential applied to the electrodes 25, 26, it is possible to adjust the number of the electrons and holes given to the recombination and therefore easy to adjust each the number of the electrons and holes.

A distance sensor equipped with the light detecting element 1 of the fourth embodiment is explained. In this case, it is necessary to control the sensitivity in order to obtain quantity of light corresponding to "A0" to "A3". The surface electrodes are arranged along normal to the plane of FIG. 14, and each electrode 25 of the electrode-set is applied with the electric potential pattern. The electrode-set is constructed with plural (e.g., more than 3) electrodes 25. Such sensitivity control is performed while the electrons are gathered in the second state. For example, when the equivalent electrons to the "A0" are gathered, the electric potential applied to the electrode 25 is controlled at the timing synchronized with the modulation signal so that the sensitivity becomes high in an equivalent period of time to the "A0", while the sensitivity becomes low in an equivalent period of time to the "A1" to "A3". In the second state, the high sensitivity state and the low sensitivity state are repeated at plural times. After the second state, the recombination of the electrons and holes is stimulated in the third state. In order to preferably stimulate the recombination, the second state and the third state are repeated at plural times, but the sensitivity control is not performed in the second state. After this operation, the state is shifted to the fourth state.

In an example, the equivalent electrons to any of the "A0" to "A3" are gathered by the sensitivity control in the second state, and then the second and third states for applying the electric potential for the recombination is repeated after the source 2 is extinguished.

In another example, the equivalent electrons to any of the "A0" to "A3" are gathered by the sensitivity control in the second state, and then first operation and second operation are sequentially performed. In the first operation, the second state and the third state are repeated while the source 2 is operated. In the second operation, the second state and the third state are repeated while the source 2 is extinguished.

Although the present invention has been described with reference to certain preferred embodiments, numerous modifications and variations can be made by those skilled in the art without departing from the true spirit and scope of this invention. For example, in the third and fourth embodiments, the buried layer 23 may be formed at the bottom of the region 31 as well as the first embodiment.

The invention claimed is:

1. A light detecting element formed in a semiconductor device, the light detecting element comprising:
   a photosensitive unit for receiving light irradiated from a light source, said photosensitive unit generating electrons and holes, each of which the number varies with quantity of light received at the photosensitive unit;
   a carrier separation unit with a separation control electrode, said carrier separation unit separating the electrons and holes generated at said photosensitive unit into object carriers and non-object carriers according to control of electric potential applied to the separation control electrode, said object carriers being one of the electrons and holes, said non-object carriers being another of the electrons and holes;
   a recombination unit with a recombination control electrode, said recombination unit stimulating recombination between the object carriers generated at said photosensitive unit in a light period and the non-object carriers generated at said photosensitive unit in an extinction period according to control of electric potential applied to the recombination control electrode, said light period being a period of time that said light source is operated, said extinction period being a period of time that said source is extinguished;
   an output unit for picking out the object carriers which remain after the recombination at said recombination unit;
   an object carrier holding unit for gathering the object carriers generated at said photosensitive unit to hold the object carriers until the recombination;
   a non-object carrier holding unit for gathering the non-object carriers generated at said photosensitive unit to hold the non-object carriers until the recombination, wherein said recombination unit stimulates the recombination between the object carriers held at said object carrier holding unit and the non-object carriers held at said non-object carrier holding unit;
   an element formation layer of a first conductive type, said element formation layer being formed on a main surface of a semiconductor substrate;
   a well region of a second conductive type, said well region being formed at a main surface side within said element formation layer;
   a surface electrode which is formed on the main surface of said element formation layer to face at least said well region though an insulating layer, said surface electrode having translucency;
   a first holding region of the second conductive type, said first holding region being formed within said well region and at the main surface side of said element formation layer as said object carrier holding unit;
   a second holding region of the first conductive type; said second holding region being formed within said first holding region and at the main surface side of said element formation layer as said non-object carrier holding unit; and
   a common control electrode as said separation control electrode and said recombination control electrode, said common control electrode being located to face said second holding region through said insulating layer, said common control electrode having translucency,
   wherein said photosensitive unit includes said element formation layer which generates the electrons and holes, and
   wherein said recombination unit includes at least one of said first holding region and said second holding region.

2. The light detecting element of claim 1, further comprising:
   a drain region of the second conductive type, said drain region being provided for disposing of the object carriers from said object carrier holding unit, said drain region being formed at the main surface side within said element formation layer and in proximity to said well region; and
   a drain electrode which is coupled to said drain region by ohmic coupling, said drain electrode being applied with electric potential so as to dispose of the object carriers from said first holding region to said drain region.

3. The light detecting element of claim 1, further comprising:
a buried layer for increasing potential barrier between said well region and said element formation layer, said buried layer being formed at the bottom of said well region,
wherein said well region within said element formation layer is formed so as to be apart from said substrate.

4. A light detecting element formed in a semiconductor device, the light detecting element comprising:
a photosensitive unit for receiving light irradiated from a light source, said photosensitive unit generating electrons and holes, each of which the number varies with quantity of light received at the photosensitive unit;
a carrier separation unit with a separation control electrode, said carrier separation unit separating the electrons and holes generated at said photosensitive unit into object carriers and non-object carriers according to control of electric potential applied to the separation control electrode, said object carriers being one of the electrons and holes, said non-object carriers being another of the electrons and holes;
a recombination unit with a recombination control electrode, said recombination unit stimulating recombination between the object carriers generated at said photosensitive unit in a light period and the non-object carriers generated at said photosensitive unit in an extinction period according to control of electric potential applied to the recombination control electrode, said light period being a period of time that said light source is operated, said extinction period being a period of time that said source is extinguished;
an output unit for picking out the object carriers which remain after the recombination at said recombination unit;
an object carrier holding unit for gathering the object carriers generated at said photosensitive unit to hold the object carriers until the recombination;
a non-object carrier holding unit for gathering the non-object carriers generated at said photosensitive unit to hold the non-object carriers until the recombination, wherein said recombination unit stimulates the recombination between the object carriers held at said object carrier holding unit and the non-object carriers held at said non-object carrier holding unit;
an element formation layer of a first conductive type, said element formation layer being formed on a main surface of a semiconductor substrate;
a well region of a second conductive type, said well region being formed at a main surface side within said element formation layer as said object carrier holding unit;
a surface electrode which is formed on the main surface of said element formation layer to face at least said well region though an insulating layer, said surface electrode having translucency;
a holding region of the first conductive type, said holding region being formed within said well region and at the main surface side of said element formation layer as said non-object carrier holding unit; and
a common control electrode as said separation control electrode and said recombination control electrode, said common control electrode being located to face a part of said holding region through said insulating layer, said common control electrode having translucency,
wherein said photosensitive unit includes said element formation layer which generates the electrons and holes, and
wherein said recombination unit includes at least one of inside and outside of said holding region within said well region.

5. The light detecting element of claim 4, further comprising:
a buried layer for increasing potential barrier between said well region and said element formation layer, said buried layer being formed at the bottom of said well region,
wherein said well region within said element formation layer is formed so as to be apart from said substrate.

6. A light detecting element formed in a semiconductor device, the light detecting element comprising:
a photosensitive unit for receiving light irradiated from a light source, said photosensitive unit generating electrons and holes, each of which the number varies with quantity of light received at the photosensitive unit;
a carrier separation unit with a separation control electrode, said carrier separation unit separating the electrons and holes generated at said photosensitive unit into object carriers and non-object carriers according to control of electric potential applied to the separation control electrode, said object carriers being one of the electrons and holes, said non-object carriers being another of the electrons and holes;
a recombination unit with a recombination control electrode, said recombination unit stimulating recombination between the object carriers generated at said photosensitive unit in a light period and the non-object carriers generated at said photosensitive unit in an extinction period according to control of electric potential applied to the recombination control electrode, said light period being a period of time that said light source is operated, said extinction period being a period of time that said source is extinguished;
an output unit for picking out the object carriers which remain after the recombination at said recombination unit;
an object carrier holding unit for gathering the object carriers generated at said photosensitive unit to hold the object carriers until the recombination;
a non-object carrier holding unit for gathering the non-object carriers generated at said photosensitive unit to hold the non-object carriers until the recombination, wherein said recombination unit stimulates the recombination between the object carriers held at said object carrier holding unit and the non-object carriers held at said non-object carrier holding unit;
an element formation layer of a second conductive type, said element formation layer being formed on a main surface of a semiconductor substrate of the second conductive type through an intermediate layer of a first conductive type;
a well region of the second conductive type, said well region being formed at a main surface side within said element formation layer as said object carrier holding unit;
a surface electrode which is formed on the main surface of said element formation layer to face at least said well region though an insulating layer, said surface electrode having translucency;
a holding region of the first conductive type, said holding region being formed within said well region and at the main surface side of said element formation layer as said non-object carrier holding unit; and a common control electrode as said separation control electrode and said recombination control electrode, said common control electrode being located to face a part of said holding region through said insulating layer, said common control electrode having translucency, wherein said photosensitive unit includes said element formation layer which generates the electrons and holes, and wherein said recombination unit includes at least one of inside and outside of said holding region within said well region.

7. The light detecting element of claim 6, further comprising:

a buried layer for increasing potential barrier between said well region and said element formation layer, said buried layer being formed at the bottom of said well region, wherein said well region within said element formation layer is formed so as to be apart from said substrate.

* * * * *